(12) United States Patent
Kim et al.

(10) Patent No.: US 9,836,219 B2
(45) Date of Patent: Dec. 5, 2017

(54) STORAGE DEVICE AND READ METHODS THEREOF

(71) Applicants: Yoon Kim, Yongin-si (KR); Kyehyun Kyung, Yongin-si (KR); Kyungryun Kim, Seoul (KR); Sangyong Yoon, Seoul (KR)

(72) Inventors: Yoon Kim, Yongin-si (KR); Kyehyun Kyung, Yongin-si (KR); Kyungryun Kim, Seoul (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 14/736,484

(22) Filed: Jun. 11, 2015

(65) Prior Publication Data

US 2016/0004437 A1    Jan. 7, 2016

(30) Foreign Application Priority Data

Jul. 4, 2014    (KR) ........................ 10-2014-0083854

(51) Int. Cl.

| | | |
|---|---|---|
| *G11C 11/56* | (2006.01) | |
| *G11C 16/10* | (2006.01) | |
| *G11C 16/26* | (2006.01) | |
| *G11C 29/52* | (2006.01) | |
| *G06F 3/06* | (2006.01) | |
| *G11C 16/32* | (2006.01) | |
| *G11C 29/02* | (2006.01) | |
| *G06F 11/10* | (2006.01) | |
| *G11C 16/04* | (2006.01) | |

(52) U.S. Cl.
CPC ............ *G06F 3/061* (2013.01); *G06F 3/0619* (2013.01); *G06F 3/0653* (2013.01);
(Continued)

(58) Field of Classification Search
CPC ........ G06F 3/061; G06F 3/069; G06F 3/0659; G06F 3/0679; G06F 11/1048; G11C 16/26; G11C 11/5642; G11C 16/08; G11C 2029/0411; G11C 29/021; G11C 29/52; G11C 16/10; G11C 2029/4402; G11C 16/32; G11C 29/023; G11C 7/08; H03M 13/11
See application file for complete search history.

(56) References Cited

U.S. PATENT DOCUMENTS 7,679,133 B2    3/2010 Son et al.
7,904,788 B2    3/2011 Brandman et al.
(Continued)

FOREIGN PATENT DOCUMENTS

| | | |
|---|---|---|
| JP | 2006268956 A | 10/2006 |
| JP | 2009026119 A | 2/2009 |
| JP | 2011070735 | 4/2011 |

*Primary Examiner* — Phung M Chung
(74) *Attorney, Agent, or Firm* — Volentine & Whitt, PLLC

(57) ABSTRACT

A read method of a storage device includes performing a first read operation on a nonvolatile memory device based on a time stamp table storing a program time and a time-read level look-up table indicating a read level shift due to a program lapsed time. A determination is made whether to adjust the time-read level look-up table based on a result of the first read operation. As a consequence of determining to adjust the time-read level look-up table, adjusting the time-read level look-up table through a valley search operation and performing a second read operation on the nonvolatile memory device based on the time stamp table and the adjusted time-read level look-up table.

29 Claims, 19 Drawing Sheets

(52) U.S. Cl.
CPC .......... *G06F 3/0659* (2013.01); *G06F 3/0679* (2013.01); *G06F 11/1048* (2013.01); *G11C 16/26* (2013.01); *G11C 16/32* (2013.01); *G11C 29/021* (2013.01); *G11C 29/023* (2013.01); *G11C 29/028* (2013.01); *G11C 29/52* (2013.01); *G11C 16/0483* (2013.01)

(56) References Cited

U.S. PATENT DOCUMENTS

| | | | |
|---|---|---|---|
| 8,000,141 B1* | 8/2011 | Shalvi | G11C 11/5628 |
| | | | 365/185.09 |
| 8,010,739 B2 | 8/2011 | Watanabe et al. | |
| 8,243,514 B2 | 8/2012 | Kang et al. | |
| 8,245,101 B2 | 8/2012 | Olbrich et al. | |
| 8,248,856 B2 | 8/2012 | Goss et al. | |
| 8,259,497 B2 | 9/2012 | Shalvi et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,355,738 B2* | 5/2016 | Im | G11C 16/349 |
| 2011/0233648 A1 | 9/2011 | Seol et al. | |
| 2012/0008414 A1 | 1/2012 | Katz et al. | |
| 2012/0239976 A1 | 9/2012 | Cometti et al. | |
| 2012/0254699 A1* | 10/2012 | Ruby | G06F 11/1048 |
| | | | 714/773 |
| 2012/0268994 A1 | 10/2012 | Nagashima | |
| 2012/0294104 A1* | 11/2012 | Mun | G11C 11/56 |
| | | | 365/218 |
| 2013/0173854 A1 | 7/2013 | Shim et al. | |

\* cited by examiner

FIG. 15

Adjusted Time-RL_LUT

| Time | Temp | Erase # | READ # | PGM # | ADDR | Read Level(RL) Shift |
|------|------|---------|--------|-------|------|----------------------|
| t1   | <T1  | <Ne1    | <Nr1   | <Np1  | A1   | ΔV11                 |
| t2   | <T1  | <Ne1    | <Nr1   | <Np1  | A2   | ΔV21                 |
| t3   | <T2  | <Ne1    | <Nr2   | <Np2  | A3   | ΔV31→ΔV31'           |
| t3   | <T3  | <Ne1    | <Nr2   | <Np2  | A3   | ΔV31'→ΔV31''         |
| t3   | <T4  | <Ne2    | <Nr2   | <Np2  | A3   | ΔV32→ΔV32'           |
| t3   | <T4  | <Ne2    | <Nr2   | <Np2  | A4   | ΔV32'→ΔV32''         |
| ...  | ...  | ...     | ...    | ...   | ...  | ...                  |

STORAGE DEVICE AND READ METHODS THEREOF

CROSS-REFERENCE TO RELATED APPLICATIONS

This U.S. non-provisional patent application claims priority under 35 U.S.C. §119 to Korean Patent Application No. 10-2014-0083854 filed Jul. 4, 2014, the subject matter of which is hereby incorporated by reference.

BACKGROUND

The technology described herein relates to a storage device and operating and read methods thereof.

Semiconductor memory devices may be classified into volatile semiconductor memory devices and nonvolatile semiconductor memory devices. The nonvolatile semiconductor memory devices may retain data stored therein even at power-off. Data stored in the nonvolatile semiconductor memory device may be permanent or reprogrammable, depending upon the fabrication technology used. The nonvolatile semiconductor memory devices may be used for user data storage and program and microcode storage in a wide variety of applications in the computer, avionics, telecommunications, and consumer electronics industries.

SUMMARY

One aspect of embodiments of the application is directed to provide a read method of a storage device which includes at least one nonvolatile memory device including a plurality of strings formed of pillars penetrating word lines stacked between bit lines and a common source line in a direction perpendicular to a substrate; and a memory controller to control the at least one nonvolatile memory device, the read method comprising performing a first read operation based on a time stamp table storing a program time and a time-read level look-up table indicating a read level shift due to a program lapsed time; determining whether to adjust the time-read level look-up table based on a result of the first read operation; as a consequence of determining that to adjust the time-read level look-up table is required, adjusting the time-read level look-up table through a valley search operation; and performing a second read operation based on the time stamp table and the adjusted time-read level look-up table.

In exemplary embodiments, the time-read level look-up table is adjusted when errors of data read during the first read operation are uncorrectable.

In exemplary embodiments, a read voltage for each of the first and second read operations is set by way of at least one of a temperature of the storage device, a temperature of the at least one nonvolatile memory device, a temperature of the memory controller, an address associated with a memory cell to be read, and a degree of deterioration associated with the memory cell to be read.

In exemplary embodiments, the read level shift of the time-read level look-up table varies with at least one of temperature, an erase count, a program count, a read count, and an address.

In exemplary embodiments, the valley search operation is performed with respect to at least one page associated with a memory cell to be read.

In exemplary embodiments, a read level shift of the time-read level look-up table is adjusted by way of a running average of a read level, obtained as a result of a previously executed valley search operation, and a read level obtained as a result of the valley search operation.

In exemplary embodiments, the read method further comprises updating the adjusted time-read level look-up table at the at least one nonvolatile memory device periodically or non-periodically.

In exemplary embodiments, the adjusting comprises adjusting the program elapsed time corresponding to the read level shift.

Another aspect of embodiments of the application is directed to provide a read method of a storage device which includes at least one nonvolatile memory device including a plurality of strings formed of pillars penetrating word lines stacked between bit lines and a common source line in a direction perpendicular to a substrate; and a memory controller to control the at least one nonvolatile memory device, the read method comprising determining whether to adjust a time-read level look-up table indicating a read level shift with a program elapsed time in response to an internal request or an external request, the internal request being issued based on environmental information; as a consequence of determining that an adjustment of the time-read level look-up table is required, adjusting the time-read level look-up table through a valley search operation; performing a read operation based on the adjusted time-read level look-up table and a time stamp table storing a program time; and conducting an error correction operation to correct an error of the read data.

In exemplary embodiments, the external request is a reliability-read request or a high-speed read request.

In exemplary embodiments, the internal request is issued based on a degree of deterioration, a temperature, and an address associated with a page to be read.

In exemplary embodiments, a read voltage is set by means of both a program elapsed time of the page to be read and at least one the degree of deterioration, the temperature, and the address.

In exemplary embodiments, the adjusting comprises performing the valley search operation on at least one page; and calculating a running average by means of a read level shift obtained as a result of the valley search operation and a read level shift stored as a result of a previous valley search operation.

In exemplary embodiments, the read method further comprises providing the time stamp table and the time-read level look-up table read from the at least one nonvolatile memory device to a buffer memory of the memory controller before determining whether to adjust the time-read level look-up table.

Still another aspect of embodiments of the application is directed to provide a read method of a storage device which includes at least one nonvolatile memory device including a plurality of strings formed of pillars penetrating word lines stacked between bit lines and a common source line in a direction perpendicular to a substrate; and a memory controller to control the at least one nonvolatile memory device, the read method comprising performing a first read operation based on a time-read level look-up table indicating a read level shift corresponding to a program elapsed time; performing an error correction operation to correct an error of data read during the first read operation; and when a result of the error correction operation indicates that the error of the read data is uncorrectable, adjusting the time-read level look-up table and performing a second read operation based on the adjusted time-read level look-up table.

A further aspect of embodiments of the application is directed to provide a storage device comprising at least one nonvolatile memory device including a plurality of strings formed of pillars penetrating word lines stacked between bit lines and a common source line in a direction perpendicular to a substrate; and a memory controller to control the at least one nonvolatile memory device, wherein the memory controller comprises a timer adapted to indicate a current time; and a read level compensation unit adapted to set a read voltage based on the current time, a time stamp table storing a program time, and a read level shift corresponding to a program elapsed time, and wherein the time-read level look-up table is adjusted in response to an external request or based on environment information.

In exemplary embodiments, each of the plurality of strings comprises at least two pillars.

In exemplary embodiments, the at least one nonvolatile memory device stores the time stamp table and the time-read level look-up table.

In exemplary embodiments, the time-read level look-up table is updated at the at least one nonvolatile memory device periodically or non-periodically.

In exemplary embodiments, the memory controller stores the time stamp table and the time-read level look-up table.

In exemplary embodiments, the memory controller stores a result of a valley search operation on a previous page and adjusts a read level based on a result of a valley search operation on a read page and the stored result.

In exemplary embodiments, the time stamp table and the time-read level look-up table are managed as a time table.

An embodiment of the application is directed to provide a method of managing a time-read level look-up table of a storage device which includes at least one nonvolatile memory device including a plurality of strings formed of pillars penetrating word lines stacked between bit lines and a common source line in a direction perpendicular to a substrate; and a memory controller to control the at least one nonvolatile memory device, the method comprising reading a time-read level look-up table from the at least one nonvolatile memory device; adjusting the time-read level look-up table by means of a valley search operation; and updating the adjusted time-read level look-up table at the at least one nonvolatile memory device periodically or non-periodically.

In exemplary embodiments, the adjusting comprises performing the valley search operation when a temperature of the storage device, a temperature of the at least one nonvolatile memory device, and a temperature of the memory controller is over a predetermined value.

In exemplary embodiments, the adjusting comprises performing the valley search operation when the program elapsed time is over a predetermined value.

With embodiments of the application, a storage device adjusts a time-read level look-up table in real time, thereby improving reliability of data markedly.

Another embodiment of the application is directed to provide a method executed by a memory controller of reading data from a nonvolatile memory. The method includes determining whether a read voltage identified for reading the data from the nonvolatile memory will be changed and adjusting the read voltage by an identified adjustment value if the determination is affirmative. Data is read from the nonvolatile memory by applying the adjusted read voltage to the nonvolatile memory when the determination is affirmative and by applying the identified read voltage to the nonvolatile memory when the determination is not affirmative.

In exemplary embodiments, the method further includes reading the data from the nonvolatile memory by applying the identified read voltage to the nonvolatile memory and performing an error correction operation on the data read from the nonvolatile memory, by way of applying the identified read voltage to the nonvolatile memory, to determine whether an error exists in the read data. The determination to adjust the read voltage is affirmative when an error is determined to exist in the read data.

In exemplary embodiments, the method further includes; a) performing an error correction operation on the data most recently read from the nonvolatile memory to determine whether an error exists therein; b) adjusting the read voltage most recently applied to the nonvolatile memory for reading the data from the nonvolatile memory by a newly identified adjustment value if an error exists in the data most recently read from the nonvolatile memory; c) reading the data from the nonvolatile memory by applying the adjusted read voltage to the nonvolatile memory; and d) repeating operations (a), (b), and (c) until no error is detected in the most recently read data or a predetermined number of repetitions has occurred.

In exemplary embodiments, the determination to adjust the read voltage is affirmative when an elapsed time from the time the data was written to the nonvolatile memory exceeds a predetermined amount of time or the temperature attributed to the nonvolatile memory exceeds a predetermined temperature.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 15 is a diagram schematically illustrating a time-read level look-up table shown in FIG. 14;

DETAILED DESCRIPTION

Figure 1:
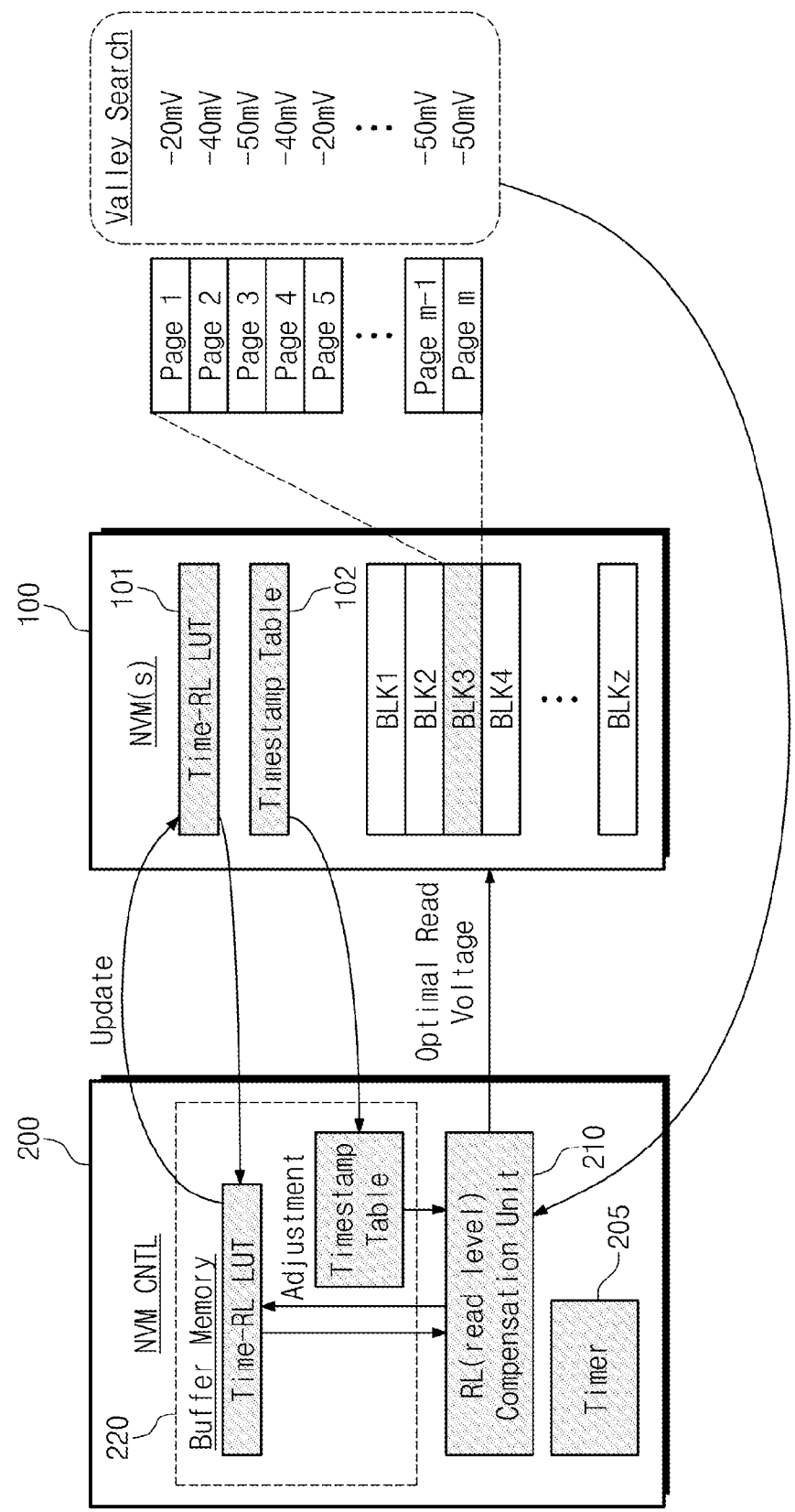
FIG. 1 is a diagram schematically illustrating a storage device for describing the technology of the application.

Embodiments will be described in detail with reference to the accompanying drawings. The application, however, may be embodied in various different forms, and should not be construed as being limited only to the illustrated embodiments. Rather, these embodiments are provided as examples so that this disclosure will be thorough and complete, and will fully convey the concept of the application to those skilled in the art. Accordingly, known processes, elements, and techniques are not described with respect to some of the embodiments of the application. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the application.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an embodiment of the application may adjust/control/change/vary/convert a time-read level look-up table for data retention. The time-read level look-up table may be a table indicating how much a read level is changed with the lapse of time.

FIG. 1 is a diagram schematically illustrating a storage device for describing the application. Referring to FIG. 1, a storage device 10 includes at least one nonvolatile memory device 100 and a memory controller 200 controlling the same.

The nonvolatile memory device 100 may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device 100 may be implemented to have a three-dimensional array structure.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The application is applicable to a Charge Trap Flash (CTF) memory device, in which a charge storage layer is made up of an insulation film, as well as a flash memory device, in which a charge storage layer is made up of a conductive floating gate. Below, the nonvolatile memory device 100 is referred to as a vertical NAND flash memory device (VNAND).

The nonvolatile memory device 100 includes a plurality of memory blocks BLK1 to BLKz (z being an integer of 2 or more). Each of the memory blocks BLK1 to BLKz consists of a plurality of pages Page 1 to Page m (m being an integer of 2 or more).

The nonvolatile memory device 100 includes a time-read level look-up table 101 and a time stamp table 102. The time-read level look-up table 101 stores a value indicating a change in a read level due to a lapse of program time (hereafter, "program elapsed time"). The time stamp table 102 stores a time when a page is programmed. In FIG. 1, an embodiment of the application is exemplified in which the time-read level look-up table 101 and the time stamp table 102 are separately stored. However, the application is not limited thereto. For example, the time-read level look-up table 101 and the time stamp table 102 may be implemented with one time table.

The memory controller 200 includes a timer 205, a read level compensation unit 210, and a buffer memory 220.

The timer 205 may be implemented by hardware, software or firmware. The timer 205 receives information associated with time from an external device and generates a current time. For example, the timer 205 may generate a current time by counting a received system clock. In other exemplary embodiments, the timer 205 may generate a current time by receiving time information from the external device and counting an internal clock. The internal clock may be produced from an oscillator of the storage device 10. The timer 205 is reset when power is turned off. Afterwards, if power is turned on, the timer 205 sets a current time newly. For example, after power-on, the timer 205 calculates a time corresponding to an optimal read voltage Vr_optimal by use of the time-read level look-up table 101 and sets a current time, based on the calculated time.

The read level compensation unit 210 may control the nonvolatile memory device 100 to set an optimal read voltage on a page to be read by use of a current time of the timer 205, the time-read level look-up table 101, and the time stamp table 102.

The read level compensation unit 210 may adjust/compensate the time-read level look-up table 101 in response to a request of a user (or, an external host) or an internal request. The internal request may be variously issued when a UECC (uncorrectable error correction code) is executed, in response to information of the generation of an error, periodically, or non-periodically.

When the time-read level look-up table 101 needs to be adjusted, the read level compensation unit 210 controls the nonvolatile memory device 100 to perform a valley search operation with respect to a memory block (e.g., BLK3). In exemplary embodiments, the valley search operation may be performed with respect to at least one page of the memory block BLK3. The valley search operation is disclosed in detail in U.S. Pat. No. 8,243,514, the entire contents of which are hereby incorporated by reference. Resultant values of the valley search operation shown in FIG. 1 are exemplary.

The buffer memory 220 temporarily stores data needed for driving. For example, the buffer memory 220 stores the time-read level look-up table 101 and the time stamp table 102 read from the nonvolatile memory device 100. The buffer memory 220 stores a time-read level look-up table adjusted by the read level compensation unit 210. The buffer memory 220 stores a time stamp table in which a program time on a newly programmed page is stored.

In exemplary embodiments, the time-read level look-up table and the time stamp table of the buffer memory 220 may be updated at areas 101 and 102 of the nonvolatile memory device 100 periodically or non-periodically.

A conventional storage device conducts a read operation, depending on a fixed time-read level look-up table. In contrast, the storage device 10 according to an embodiment of the application may adjust the optimized time-read level look-up table 101 in real time, thereby improving reliability of data.

Figure 2:
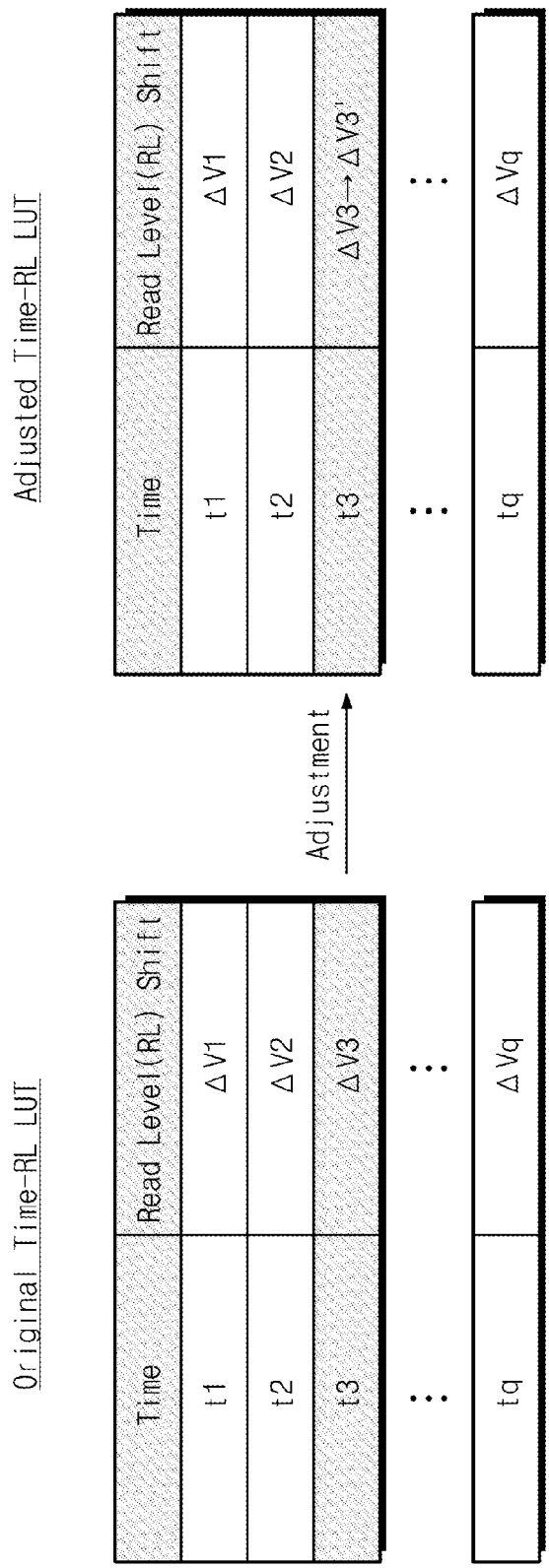
FIG. 2 is a diagram for describing how a time-read level look-up table shown in FIG. 1 is adjusted.

FIG. 2 is a diagram for describing how a time-read level look-up table shown in FIG. 1 is adjusted. Referring to FIG. 2, a time-read level look-up table is adjustable. For example, as a valley search operation is performed at a specific program elapsed time t3, a read level shift is adjusted from ΔV3 to ΔV3'.

In exemplary embodiments, an original time-read level look-up table is decided under the assumption that the storage device 10 operates in a constant temperature. An adjusted time-read level look-up table is decided under an operation temperature (varying) of the storage device 10.

Figure 3:
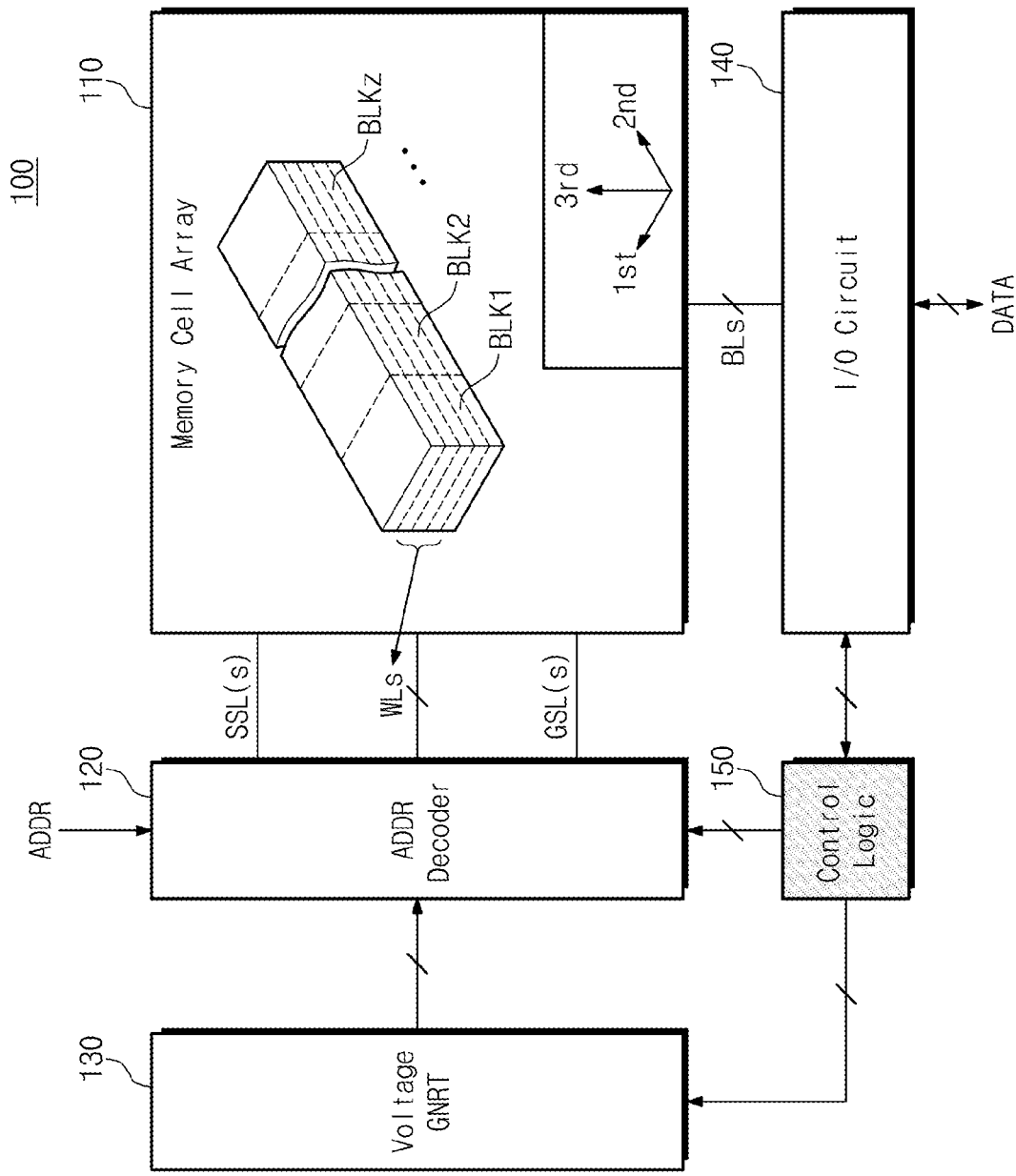
FIG. 3 is a block diagram schematically illustrating a nonvolatile memory device according to an embodiment of the application.

FIG. 3 is a block diagram schematically illustrating a nonvolatile memory device 100 according to an embodiment of the application. Referring to FIG. 3, a nonvolatile memory device 100 includes a memory cell array 110, an address decoder 120, a voltage generation circuit 130, an input/output circuit 140, and control logic 150.

The memory cell array 110 includes a plurality of memory blocks BLK1 through BLKz (z being an integer of 2 or more), each of which is connected to the address decoder 120 via word lines WLs, at least one string selection line SSL, and at least one ground selection line GSL and to the input/output circuit 140 via bit lines BLs. In exemplary embodiments, the word lines WLs may be formed to have a shape where plates are stacked.

The memory blocks BLK1 through BLKz may include a plurality of strings that are three-dimensionally arranged on a substrate along a first direction and a second direction different from the first direction and along a third direction (i.e., a direction perpendicular to a plane formed in the first and second directions). Herein, each string may contain at least one string selection transistor, a plurality of memory cells, and at least one ground selection transistor connected in series in a direction perpendicular to the substrate. Each memory cell may store one or more bits. In exemplary embodiments, at least one dummy cell may be provided between at least one string selection transistor and a plurality of memory cells. As another example, at least one dummy cell may be provided between a plurality of memory cells and at least one ground selection transistor.

The address decoder 120 selects one of the memory blocks BLK1 to BLKz in response to an address ADDR. The address decoder 120 is connected to the memory cell array 110 through the word lines WLs, the at least on string selection line SSL, and the at least one ground selection line GSL. The address decoder 120 selects the word lines WLs, the at least one string selection line SSL, and the at least one ground selection line GSL using a decoded row address. The address decoder 120 decodes a column address of an input address ADDR. The decoded column address may be transferred to the input/output circuit 140. In exemplary embodiments, the address decoder 120 may include the following: a row decoder, a column decoder, and an address buffer.

The voltage generation circuit 130 generates operating voltages including the following: a program voltage, a pass voltage, a read voltage, a read pass voltage, a verification voltage, an erase operation voltage, a common source line voltage, and a well voltage. The voltage generation circuit 130 also generates a word line voltage needed for a program/read/erase operation. These voltages are provided to the address decoder 120.

The input/output circuit 140 is connected to the memory cell array 110 through the bit lines BLs. The input/output circuit 140 is configured to receive the decoded column address from the address decoder 120. The input/output circuit 140 selects the bit lines BLs depending on the decoded column address.

The input/output circuit 140 may contain a plurality of page buffers that store program data at a program operation and reads data at a read operation. Each of the page buffers may include a plurality of latches. During a program operation, data stored in the page buffers may be programmed at a page of a selected memory block. During a read operation, data read from a page of a selected memory block may be stored in the page buffers via the bit lines. Meanwhile, the input/output circuit 140 reads data from a first area of the memory cell array 110 and then stores the read data in a second area of the memory cell array 110. For example, the input/output circuit 140 is configured to perform a copyback operation. The input/output circuit 140 may output buffered data DATA to an external device or receive data DATA for subsequent storage in the memory cell array 110.

The control logic 150 controls an overall operation of the VNAND 100, including, but not limited to, a program operation, a read operation, and an erase operation. The control logic 150 operates in response to control signals or commands that are provided from the external device.

At a read operation, the control logic 150 corrects a level of a read voltage depending on read level compensation information from a memory controller 200 (refer to FIG. 1).

The nonvolatile memory device 100 according to an embodiment of the application may operate using an optimal read voltage at a read operation, thereby improving reliability of data.

Figure 4:
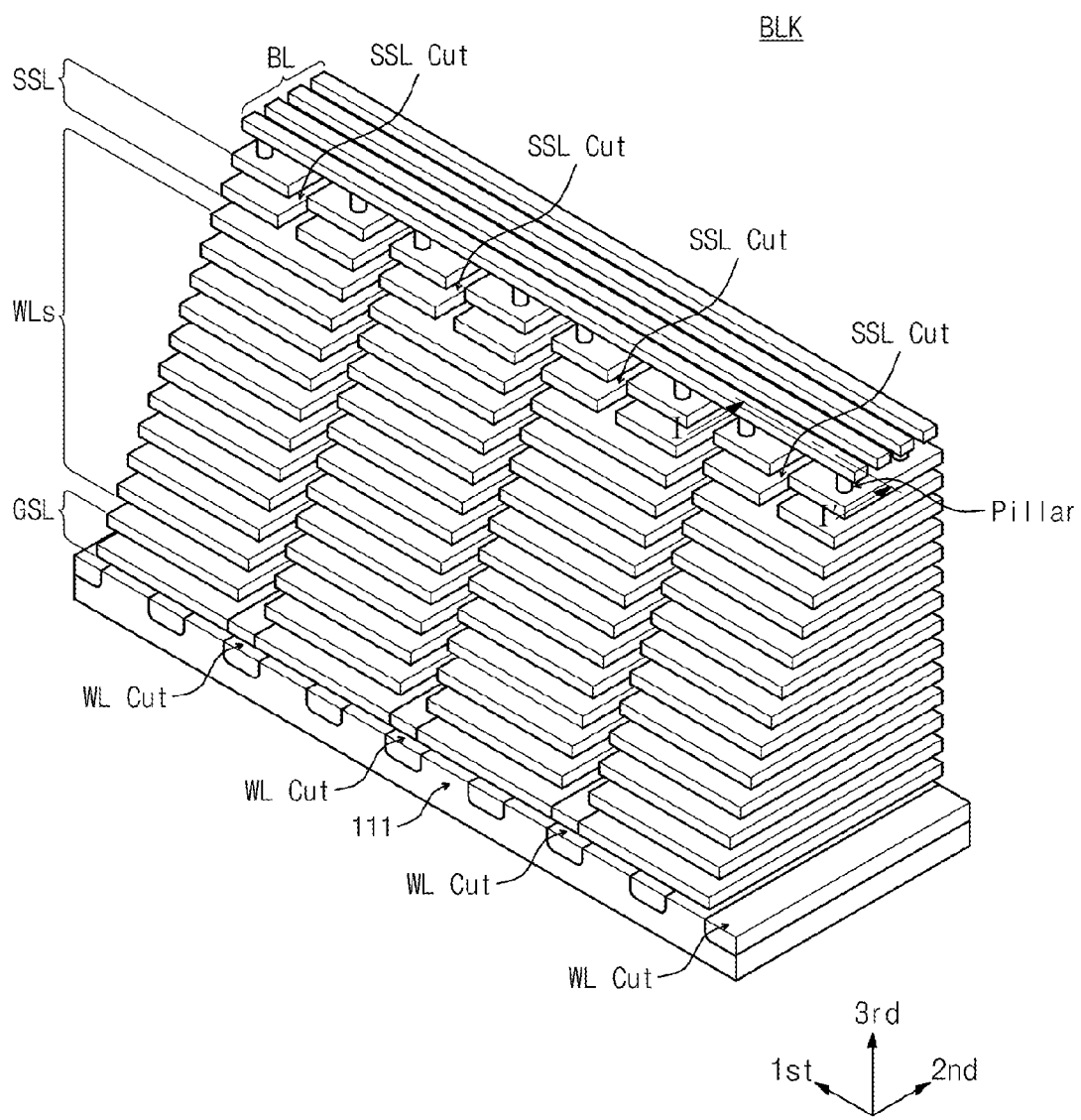
FIG. 4 is a perspective view of a memory block shown in FIG. 1.

FIG. 4 is a perspective view of a memory block BLK shown in FIG. 1. Referring to FIG. 4, four sub blocks are formed on a substrate. the sub blocks are formed by stacking and cutting at least one ground selection line GSL, a plurality of word lines, and at least one string selection line SSL on the substrate in a plate shape.

The at least one string selection line SSL is separated by string selection line cuts.

In exemplary embodiments, at least one plate-shaped dummy line is formed between the ground selection line GSL and the word lines WLs. Alternatively, at least one plate-shaped dummy line is formed between the word lines and the string selection line SSL.

Although not shown in FIG. 4, each word line cut WL Cut may include a common source line CSL. In exemplary embodiments, the common source lines CSL included in the word line cuts WL Cuts may be interconnected. A string may be formed by making a pillar Pillar connected to a bit line BL penetrate the at least one string selection line SSL, the word lines, and the at least one ground selection line GSL.

In FIG. 4, an embodiment of the application is exemplified in which a structure between word line cuts WL Cuts adjacent to each other is a sub block. However, the application is not limited thereto. For example, a structure between a word line cut WL Cut and a string selection line cut SSL Cut may be defined as a sub block.

The memory block BLK according to an embodiment of the application may be implemented to have a merged word line structure where two word lines are merged to one.

Figure 5:
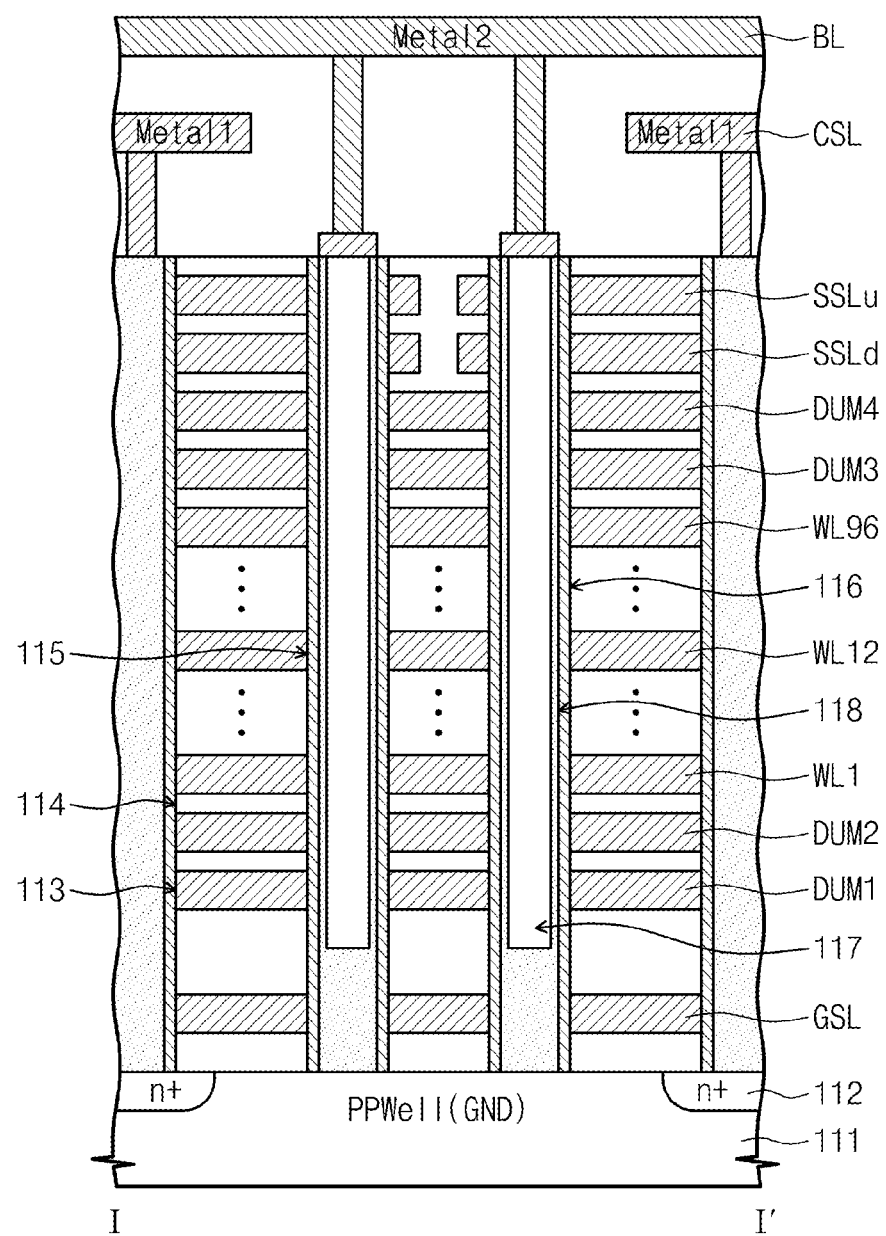
FIG. 5 is a cross-sectional view taken along a line I-I' of a memory block shown in FIG. 4.

FIG. 5 is a cross-sectional view taken along a line I-I' of a memory block shown in FIG. 4. Referring to FIG. 5, a memory block BLK is formed in a direction perpendicular to a substrate 111. An n+ doping region 112 is formed in the substrate 111.

A gate electrode layer 113 and an insulation layer 114 are deposited on the substrate 111 in turn. An information storage layer 115 is formed on lateral surfaces of the gate electrode layer 113 and the insulation layer 114.

The gate electrode layer 113 is connected to a ground selection line GSL, a plurality of word lines WL1 through WL8, string selection lines SSLu and SSLd, and dummy lines DUM1 through DUM4.

The information storage layer 115 consists of a tunnel insulation layer, a charge storage layer, and a blocking insulation layer. The tunnel insulation layer may act as an insulation layer where charge moves due to the tunneling effect. The charge storage layer may be made up of an insulation layer that traps charge. The charge storage layer may be formed of SiN or a metal (aluminum or hafnium) oxide layer. The blocking insulation layer may act as an insulation layer between the gate electrode layer and the charge storage layer. The blocking insulation layer may be formed of a silicon oxide layer. In exemplary embodiments, the tunnel insulation layer, charge storage layer, and blocking insulation layer may constitute an ONO (Oxide-Nitride-Oxide) structure of insulation layer.

A pillar 116 is formed by vertically patterning the gate electrode layer 113 and the insulation layer 114.

The pillar 116 penetrates the gate electrode layer 113 and the insulation layers 114 and is connected between a bit line BL and the substrate 111. The inside of the pillar 116 forms a filing dielectric pattern and is made up of an insulation material such as silicon oxide or an air gap. The outside of the pillar 116 forms a vertical active pattern 118 and is made up of a channel semiconductor. In exemplary embodiments, the vertical active pattern 118 is formed of a p-type silicon layer. A memory cell included in a string may be constituted of the filing dielectric pattern 117, the vertical active pattern 118, the information storage layer 115, and the gate electrode layer 113 that are disposed sequentially from the inside of the pillar 116.

Common source lines CSL extend on the n+ doping regions 112. The common source lines CSL may be included in word line cuts in a wall shape.

Figure 6:
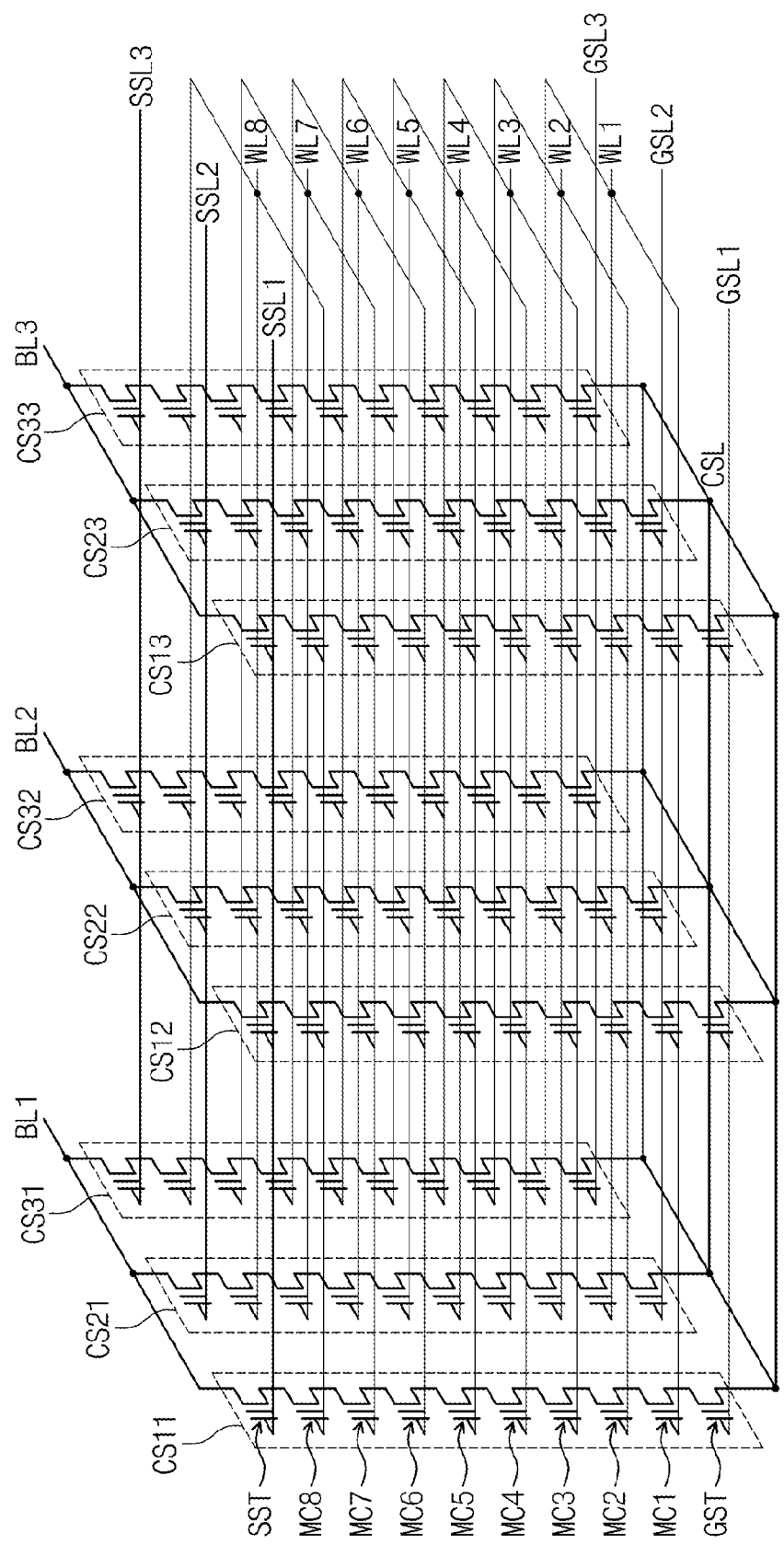
FIG. 6 is a circuit diagram schematically illustrating an equivalent circuit of a memory block shown in FIG. 4, according to an embodiment of the application.

FIG. 6 is a circuit diagram schematically illustrating an equivalent circuit of a memory block BLK shown in FIG. 4, according to an embodiment of the application. Referring to FIG. 6, cell strings CS11 through CS33 are connected between bit lines BL1 through BL3 and a common source line CSL. Each cell string (e.g., CS11) includes a string selection transistor SST, a plurality of memory cells MC1 through MC8, and a ground selection transistor GST. In FIG. 6, an embodiment of the application is exemplified as a string that includes eight memory cells. However, the application is not limited thereto.

The string selection transistors SST are connected to a string selection line SSL. The string selection line SSL is divided into first to third string selection lines SSL1 to SSL3. In FIG. 6, an embodiment of the application is exemplified as three string selection line SSL1 to SSL3 correspond to a bit line. However, the application is not limited thereto. The memory block BLK of the application may be implemented to include at least two string selection lines corresponding to a bit line.

The ground selection transistor GST is connected to a ground selection line GSL1. Ground selection lines GSL1~GSL3 of cell strings may be interconnected or separated. The string selection transistors SST are connected to bit lines BL1 to BL3, and the ground selection transistors GST are connected to the common source line CSL.

In each string, the memory cells MC1 through MC8 are connected to corresponding word lines WL1 through WL8. A set of memory cells that are connected to a word line and programmed at the same time may be referred to as a page. The memory block BLK is formed of a plurality of pages. Also, a word line is connected with a plurality of pages. Referring to FIG. 6, a word line (e.g., WL4) with the same height from the common source line CSL is connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In case of a 2-bit MLC, two pages of data are stored at a physical page. This means that six pages of data are stored at memory cells connected to the fourth word line WL4.

A nonvolatile memory device 100 may be implemented with a charge trap flash (CTF) memory device. In this case, there may be generated the initial verify shift (IVS) phenomenon that charge trapped in a programmed CTF is redistributed and leaked by the lapse of time. Reprogramming may be performed to overcome such distribution deterioration.

In FIG. 6 an embodiment of the application is exemplified as ground selection lines are separated. However, the application is not limited thereto. For example, ground selection lines may be implemented to have a shared structure.

Figure 7:
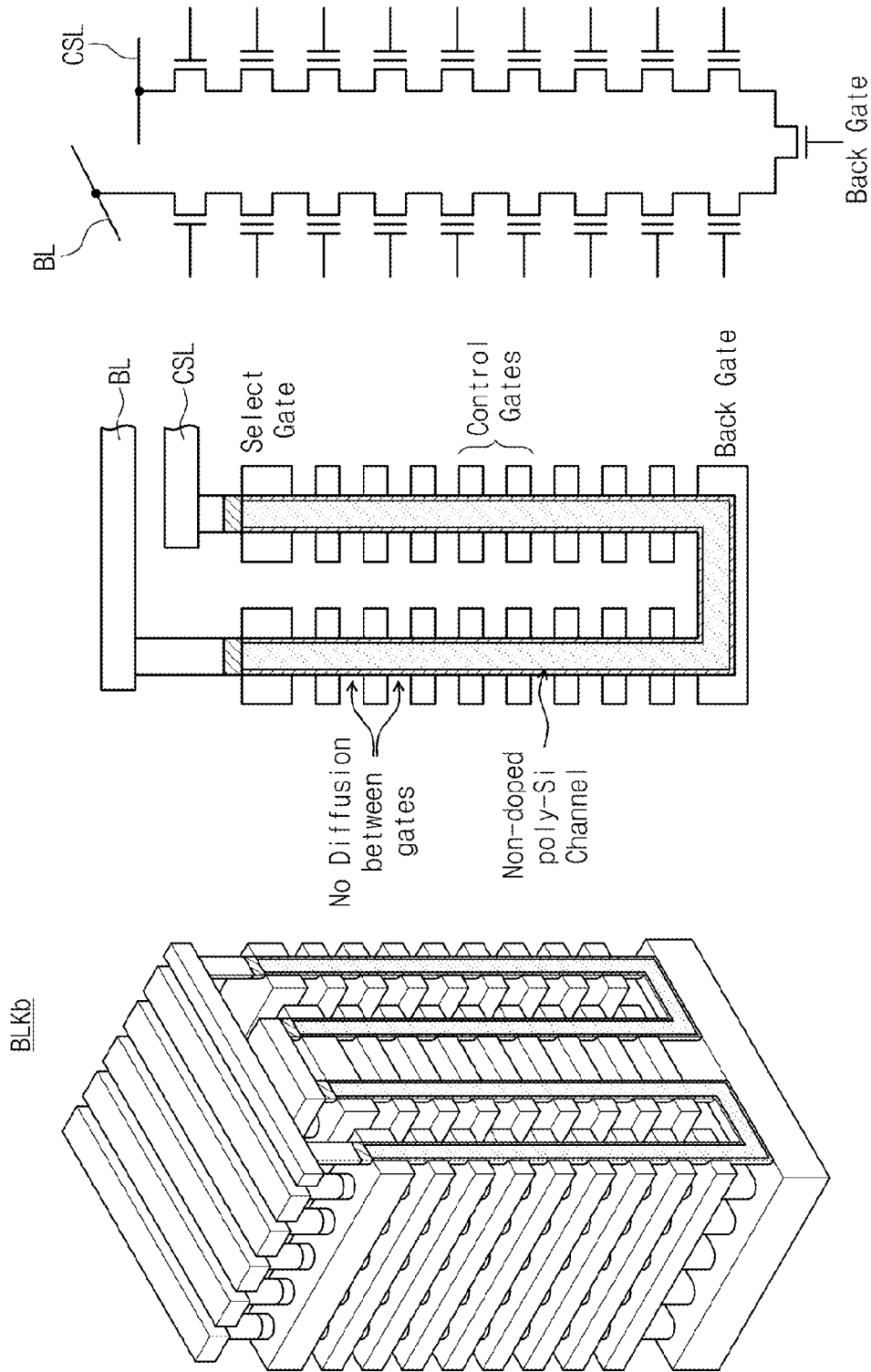
FIG. 7 is a diagram schematically illustrating a memory block according to another embodiment of the application.

FIG. 7 is a diagram schematically illustrating a memory block according to another embodiment of the application. Referring to FIG. 7, a string is formed between a bit line BL and a common source line CSL and includes first memory cells formed between the bit line BL and a substrate in a vertical direction and second memory cells formed between the substrate and a common source line CSL in the vertical direction. That is, the string includes two pillars and has a U-type pipe shape.

In exemplary embodiments, a memory block BLKb may have a Pipe-shaped Bit Cost Scalable (P-BiCS) structure where bit lines and source lines are disposed over stacked memory cells. A channel is formed to be directly connected to a substrate.

Figure 8:
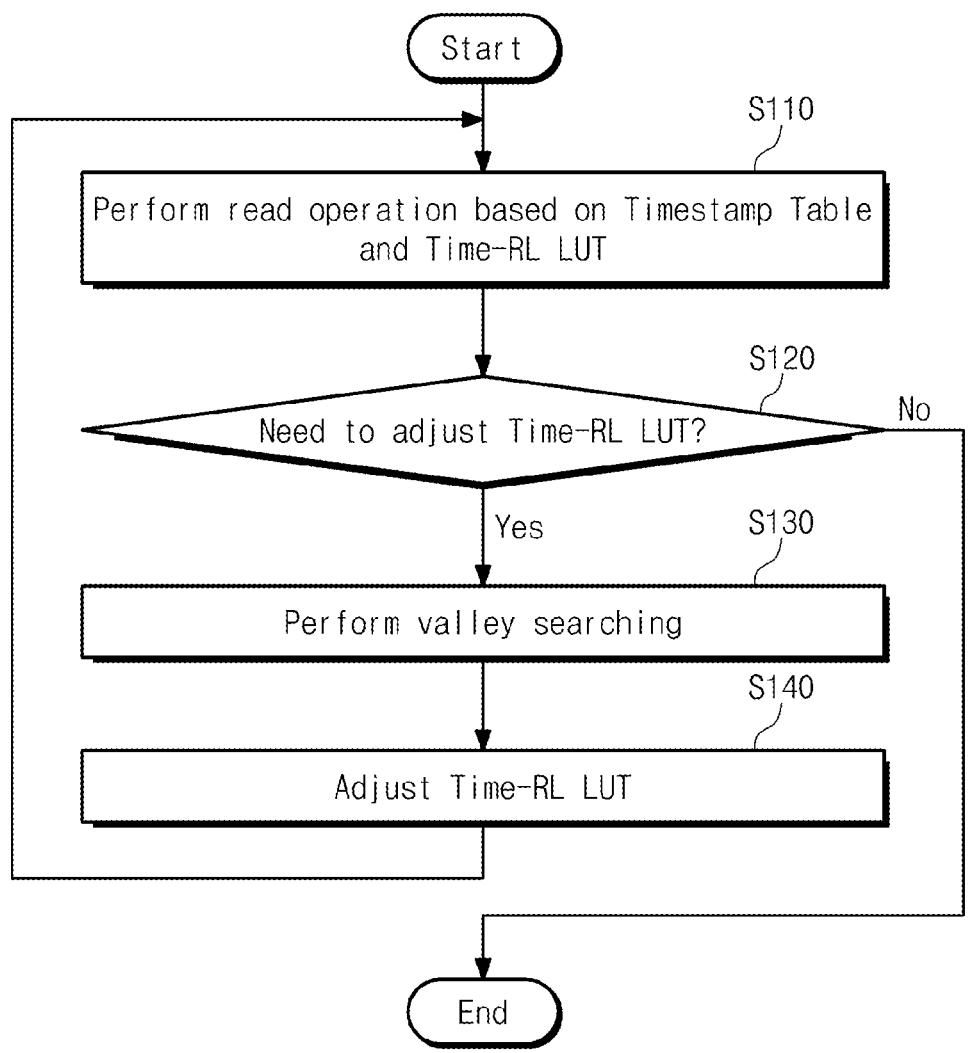
FIG. 8 is a flow chart schematically illustrating a read method of a storage device, according to an embodiment of the application.

FIG. 8 is a flow chart schematically illustrating a read method of a storage device, according to an embodiment of the application. Described is a read method of a storage device 10 with reference to FIGS. 1 through 8.

When a read request is received, in step S110, a read operation is conducted depending on a time stamp table and a time-read level look-up table. The read operation may be performed by means of an optimal read voltage that is determined in view of a current time of a timer 205 (refer to FIG. 1) and a program elapsed time.

In step S120, whether to adjust the time-read level look-up table is determined depending on a result of the read operation. For example, whether to adjust the time-read level look-up table may be determined depending on the number of errors generated during the read operation. If the number of errors generated during the read operation exceeds a predetermined number, the time-read level look-up table needs to be adjusted.

As a consequence of determining that an adjustment of the time-read level look-up table is required, in step S130, a valley search operation is conducted with respect to a memory block including a page to be read. As the valley search operation is conducted, a valley of any one program state is searched with respect to a page. A read level shift is newly decided depending on a result of the valley search operation. In step S140, the time-read level look-up table is adjusted such that an original read level shift corresponding to a program elapsed time is updated with the calculated read level shift. The time-read level look-up table may be updated at a nonvolatile memory device 100 periodically or non-periodically, depending on a policy of the storage device 10. In other exemplary embodiments, the time-read level look-up table may be updated at the nonvolatile memory device 100 at the same time when it is adjusted (or, just after the time-read level look-up table is adjusted).

After the time-read level look-up table is adjusted, the method proceeds to step S110. Returning to step S120, if adjustment on the time-read level look-up table is not required, the read operation may end.

As described above, whether to adjust a time-read level look-up table is determined, and the time-read level look-up table is adjusted through valley searching, depending on the determination.

In FIG. 8, an embodiment of the application is exemplified in which a time-read level look-up table is adjusted after a read operation is conducted. However, the application is not limited thereto. For example, a read operation may be conducted after the time-read level look-up table is adjusted.

Figure 9:
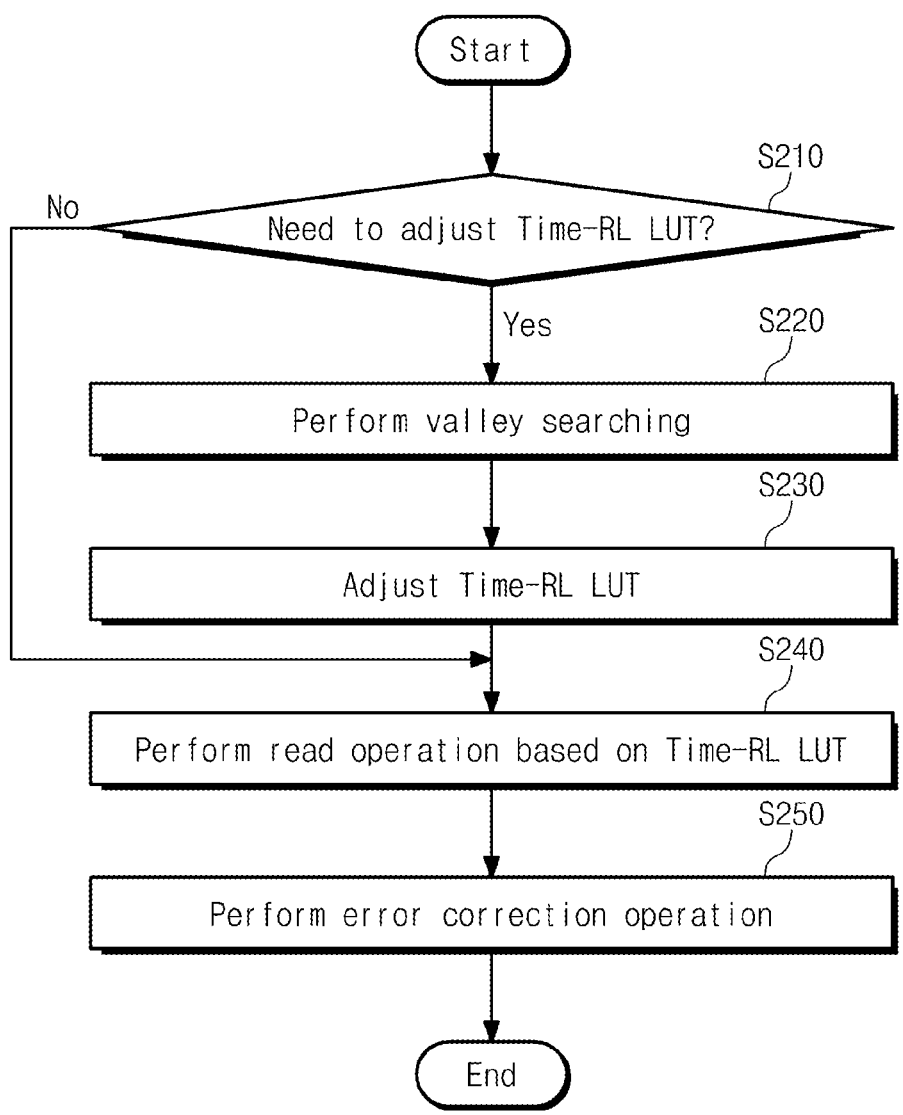
FIG. 9 is a flow chart schematically illustrating a read method of a storage device, according to a second embodiment of the application.

FIG. 9 is a flow chart schematically illustrating a read method of a storage device, according to a second embodiment of the application. Described is a read method with reference to FIGS. 1 through 9.

When a read operation is requested, in step S210, whether to adjust a time-read level look-up table is determined. The time-read level look-up table may be adjusted when a reliability-read operation is requested from a host. In other exemplary embodiments, the time-read level look-up table may be adjusted when a program elapsed time of a page where data to be read is stored exceeds a predetermined value. The time-read level look-up table may be adjusted when a temperature of the storage device 10, a temperature of the nonvolatile memory device 100, or a temperature of the memory controller 200 is over a predetermined value. The time-read level look-up table may be adjusted depending on characteristic information (e.g., time information, wear-leveling information, and organization information (address)) of a memory block where data to be read is stored.

As a consequence of determining that an adjustment on the time-read level look-up table is required, in step S220, a valley search operation is conducted with respect to a memory block including a page to be read. As the valley search operation is conducted, a read level shift is newly decided. In step S230, the time-read level look-up table is adjusted such that a prior read level shift corresponding to a program elapsed time is updated with the calculated read level shift.

When adjustment on the time-read level look-up table is not required or when the time-read level look-up table is adjusted in step S230, in step S240, a read operation on the read request is performed depending on the time-read level look-up table. Carried out, in step S250, is an error correction operation on read data. Afterwards, the read operation may end.

As described above, whether to adjust the time-read level look-up table is first determined before a read operation is conducted.

Figure 10:
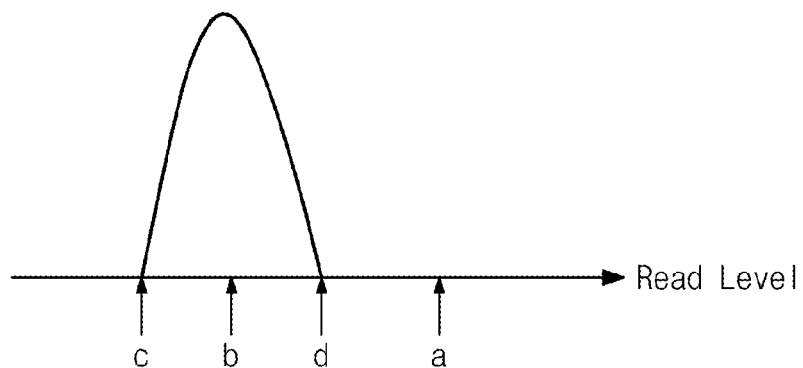
FIG. 10 is a diagram schematically illustrating a valley position distribution obtained when a valley search operation is conducted, according to an embodiment of the application.

FIG. 10 is a diagram schematically illustrating a valley position distribution obtained when a valley search operation is conducted, according to an embodiment of the application. Referring to FIG. 10, 'a' indicates a read level of an original time-read level look-up table. It is understood from a result of a valley search operation that most memory cells are placed at a valley position of 'b'. Hence, a read level is adjusted from 'a' to 'b', thereby making it possible to minimize errors generated during a read operation.

Figure 11:
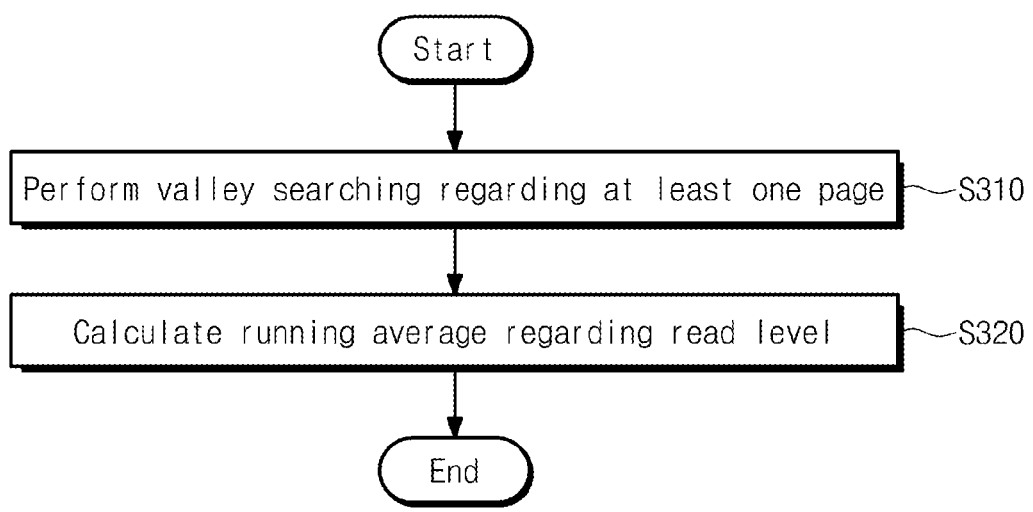
FIG. 11 is a flow chart schematically illustrating a read level adjusting method that utilizes a valley search operation according to an embodiment of the application.

FIG. 11 is a flow chart schematically illustrating a read level adjusting method that utilizes a valley search operation according to an embodiment of the application. A read level adjusting method will be more fully described with reference to FIGS. 10 and 11.

Performed, in step S310, is a valley search operation on at least one page. As the valley search operation is conducted, as illustrated in FIG. 10, a new valley position 'b' is determined. The degree of the calculated read level shift may be updated at a time read level look-up table (S220).

Calculated in step S320 is an average of a new valley position and previously calculated valley positions. A read level to be updated may be expressed by the following equation (1) as a running average value.

$$\Delta Vth_{update} = \frac{N-1}{N} \Delta Vth_{original} + \frac{1}{N} \Delta Vth_{valley\text{-}search} \quad (1)$$

In the equation (1) '$\Delta Vth_{update}$' indicates a read level shift, '$\Delta Vth_{original}$' indicates an original read level shift, and '$\Delta Vth_{valley\text{-}search}$' indicates a read level shift obtained as a result of a valley search operation. That is, an average of valley positions previously searched N times is updated, not a value of a valley position searched through one valley search operation.

A technique of updating a parameter value by read level adjustment is applicable to a '$\Delta Vth$' value as well as any other parameters. The same effect may be obtained by changing a reference time in a time-read level look-up table. Also, the application is applicable to a read level adjustment way where there is used any other information (e.g., temperature, cycle, and read frequency) except time information.

The above-described read level adjustment may be made depending on a result of a valley search operation on a plurality of pages. However, the application is not limited thereto. A read level may be adjusted depending on a result of a valley search operation on one page.

In exemplary embodiments, a time-read level look-up table may be adjusted with a result of an error correction operation.

Figure 12:
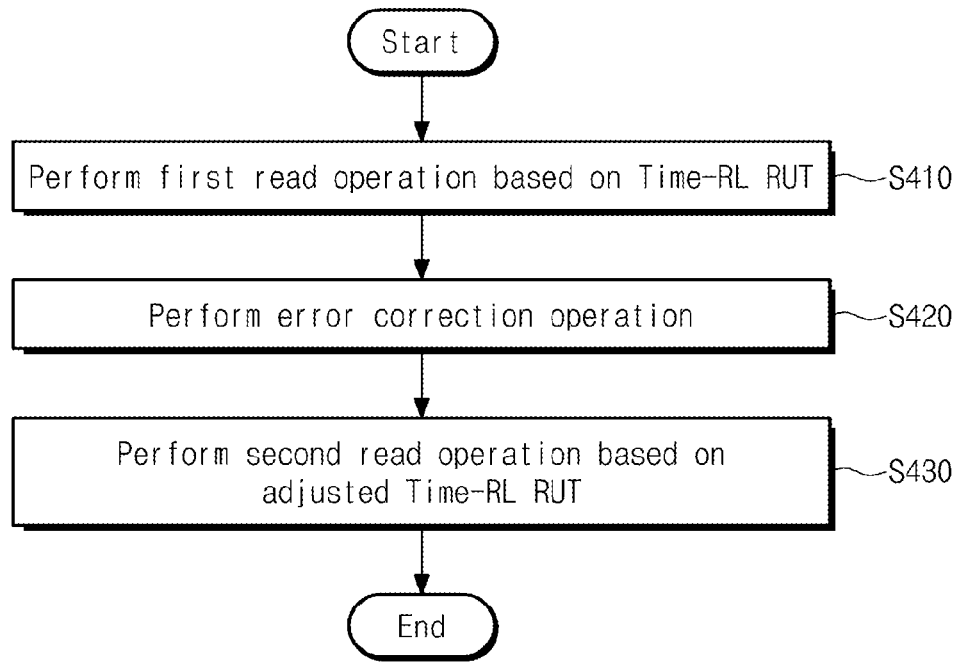
FIG. 12 is a flow chart schematically illustrating a read method of a storage device, according to a third embodiment of the application.

FIG. 12 is a flow chart schematically illustrating a read method of a storage device, according to a third embodiment of the application. Described is a read method with reference to FIGS. 1 through 12. In step S410, a first read operation is carried out depending on a time-read level look-up table. Performed, in step S420, is an error correction operation on the first read operation. If a result of the error correction operation indicates that read data is uncorrectable, in step S430, a second read operation is conducted based on an adjusted time-read level look-up table. An error correction operation on the second read operation may also be carried out.

As described above, a time-read level look-up table is adjusted based on an error correction result, and a read operation is conducted by means of the time-read level look-up table thus adjusted.

Figure 13:
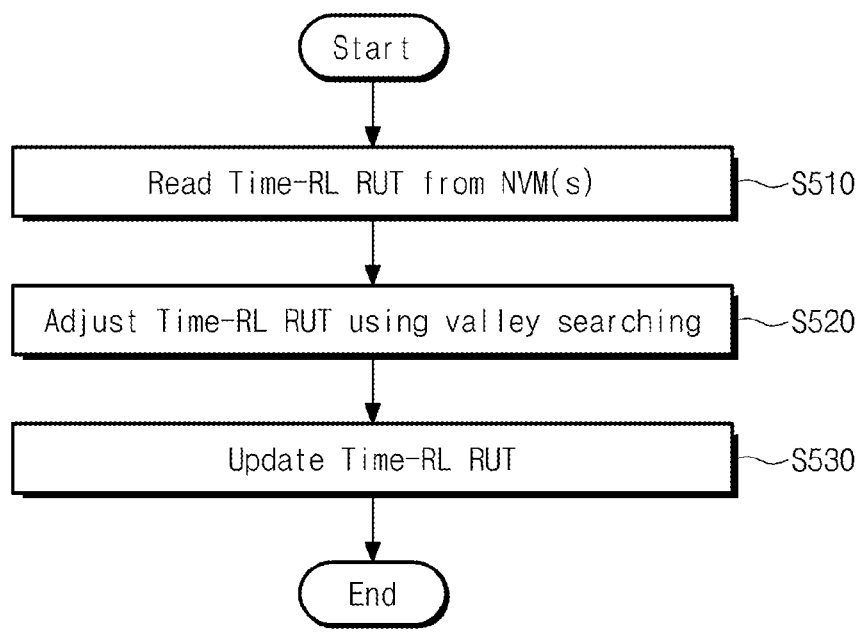
FIG. 13 is a flow chart schematically illustrating a method of managing a time-read level look-up table, according to an embodiment of the application.

FIG. 13 is a flow chart schematically illustrating a method of managing a time-read level look-up table, according to an embodiment of the application. A method of managing a time-read level look-up table will be more fully described with reference to FIGS. 1 through 13.

When the storage device 10 is powered up, in step S510, a time-read level look-up table is read from the nonvolatile memory device 100. In step S520, if necessary, the time-read level look-up table is adjusted using a valley search operation. The valley search operation may be conducted when a temperature of the storage device 10, a temperature of the nonvolatile memory device 100, or a temperature of the memory controller 200 is over a predetermined value. In other exemplary embodiments, the valley search operation may be conducted when a program elapsed time exceeds a predetermined value. In step S530, the time-read level look-up table is updated at the nonvolatile memory device 100 depending on a policy of the storage device 10 or in response to a user's request.

As described above, the time-read level look-up table is adjusted using the valley search operation. However, the application is not limited thereto. The time-read level look-up table may be adjusted using a variety of environment information influencing a read level.

Figure 14:
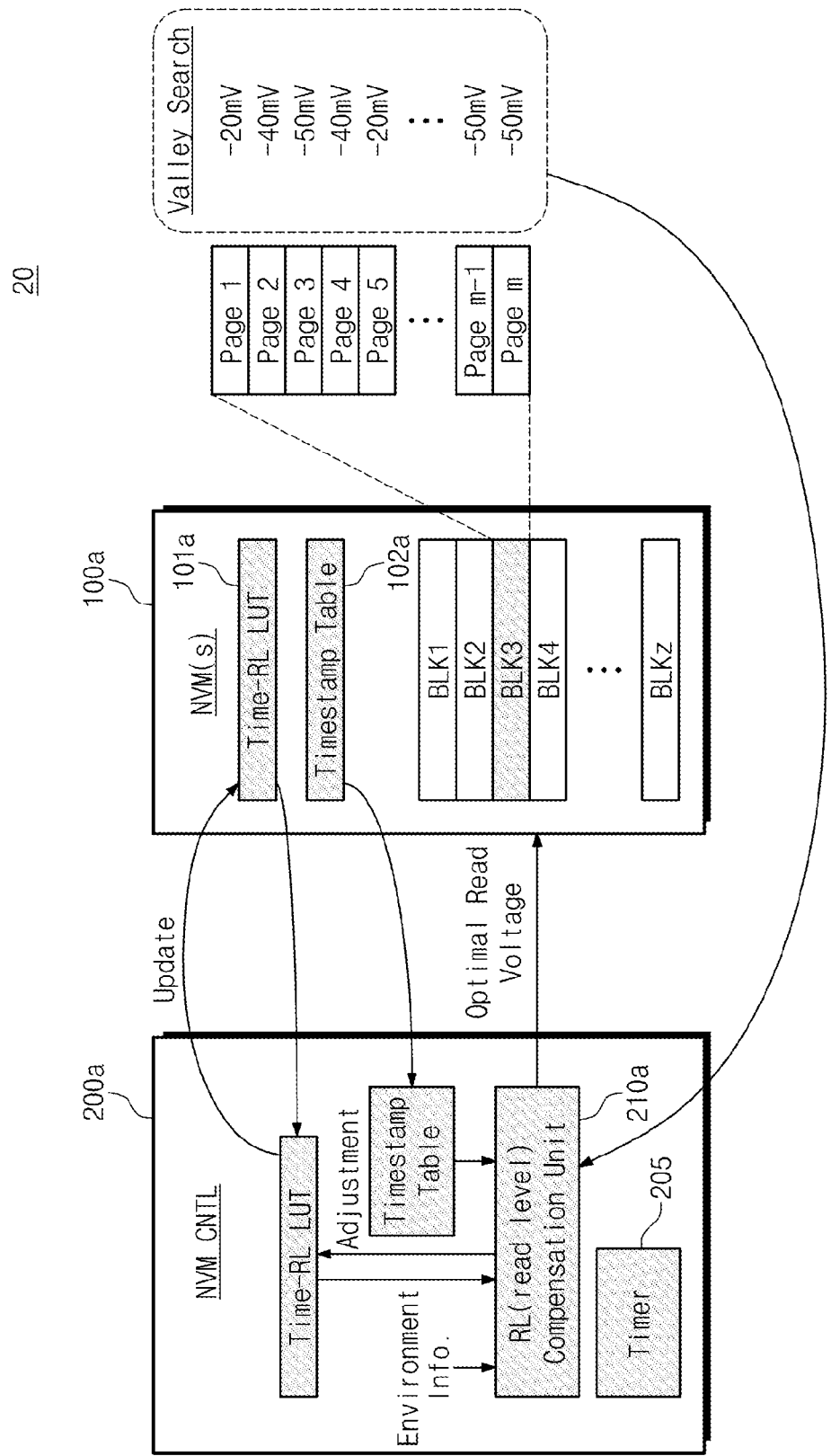
FIG. 14 is a block diagram schematically illustrating a storage device according to another embodiment of the application.

FIG. 14 is a block diagram schematically illustrating a storage device according to another embodiment of the application. Referring to FIG. 14, a storage device 20 includes a nonvolatile memory device 100a and a memory controller 200a controlling the same. As compared with the storage device 10 shown in FIG. 1, a read level compensation unit 210a of the storage device 20 may generate an optimal read voltage additionally considering environment information.

A time-read level look-up table 101a includes environment information as well as time information and a read level shift due to lapse of time. The environment information may be at least one selected from a group of a program elapsed time, a program temperature, a read temperature, a word line address, a block address, a die address, an erase cycle, a program cycle, and a read cycle associated with a memory cell to be read. Timer 205a and timestamp table 102a operate similarly to their counterparts of timer 205 and timestamp table 102, illustrated in FIG. 1, and descriptions of their operations are omitted here.

FIG. 15 is a diagram schematically illustrating a time-read level look-up table shown in FIG. 14. Referring to FIG. 15, a time-read level look-up table includes items such as time, temperature, erase cycle, read cycle, program cycle, address, and read level shift. As understood from an adjusted time-read level look-up table, a read level is changed depending on a combination of conditions corresponding to a specific time 't3'. For example, the conditions may include the following: temperature (T2<T3<T4), erase cycle (Ne1<Ne2), read cycle (Nr2), program cycle (Np2), and addresses (A3, A4).

In storage devices 10 and 20 shown in FIGS. 1 and 14, a time-read level look-up table and a time stamp table are stored in a nonvolatile memory device (100 or 100a). However, the application is not limited thereto. For example, a storage device according to an embodiment of the application may be implemented such that the time-read level look-up table and the time stamp table are stored in a nonvolatile memory device of a memory controller.

Figure 16:
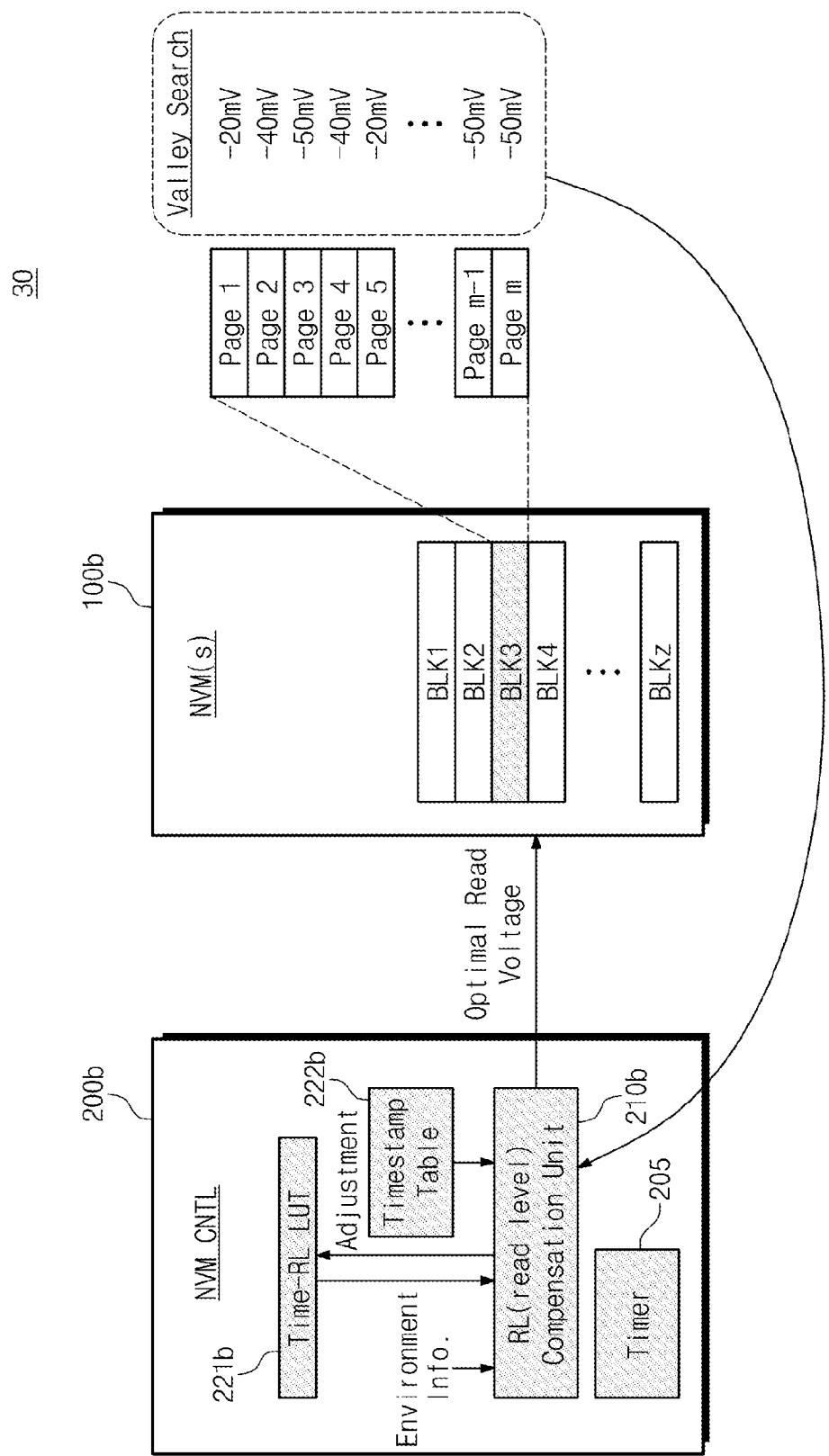
FIG. 16 is a block diagram schematically illustrating a storage device according to still another embodiment of the application.

FIG. 16 is a block diagram schematically illustrating a storage device according to still another embodiment of the application. Referring to FIG. 16, a storage device 30 is different from storage devices 10 and 20 shown in FIGS. 1 and 14 in that a time-read level look-up table 221b and a time stamp table 222b are stored in a nonvolatile memory device of a memory controller 200b, such as ROM, PRAM, MRAM, and FRAM. Otherwise, the read level compensation unit 210b, timer 205, and nonvolatile memory 100b are similar to their counterparts read level compensation unit 210/210a, timer 205, and nonvolatile memory 100/100a illustrated in FIGS. 1 and 14; accordingly, their descriptions are not repeated here.

Figure 17:
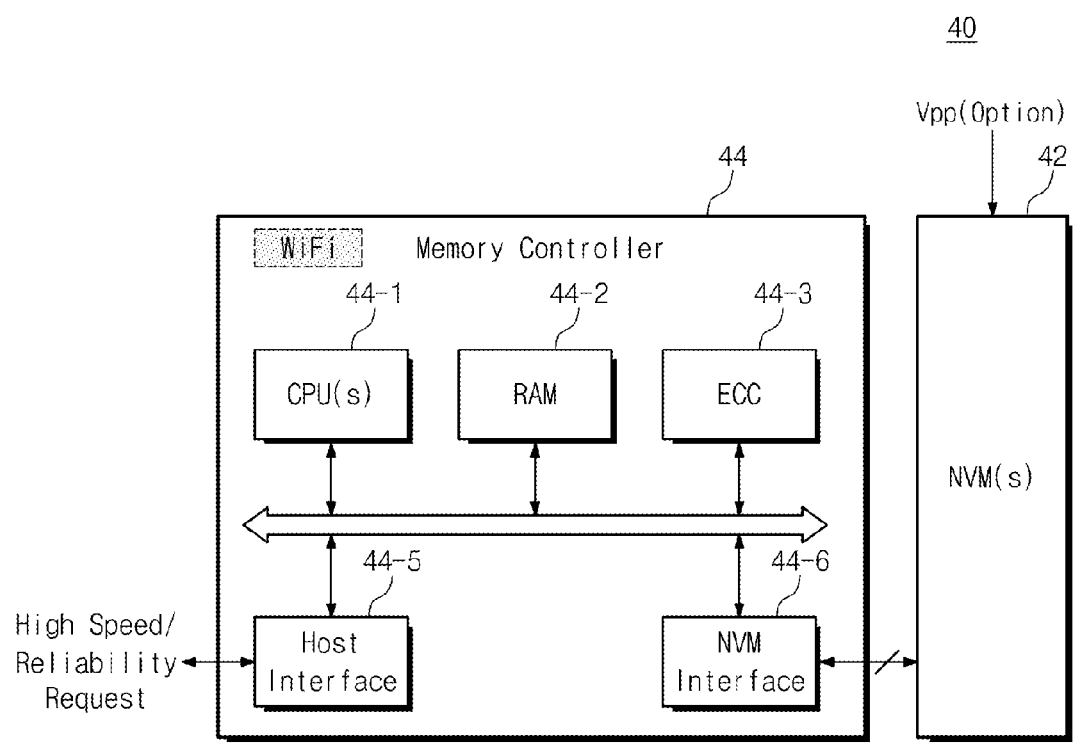
FIG. 17 is a block diagram schematically illustrating a storage device according to an embodiment of the application.

FIG. 17 is a block diagram schematically illustrating a storage device 40 according to an embodiment of the application. Referring to FIG. 17, the storage device 40 includes at least one nonvolatile memory device 42 and a memory controller 44 to control the nonvolatile memory device 42. The storage device 40 shown in FIG. 17 may be used as, but not limited to, a storage medium of a memory card (e.g., CF, SD, micro SD, and so on) or as a USB storage device.

The nonvolatile memory device 42 may be implemented with a nonvolatile memory device described with reference to FIG. 1, the nonvolatile memory device 100a described with reference to FIG. 14, or the nonvolatile memory device 100b described with reference to FIG. 16. The memory controller 44 may be implemented with the memory controller 200 described with reference to FIG. 1, the memory controller 200a described with reference to FIG. 14, or the memory controller 200b described with reference to FIG. 16.

The memory controller 44 starts to adjust a time-read level look-up table in response to a specific request of a host. For example, the memory controller 44 first adjusts the time-read level look-up table in response to a request of a reliability-read mode of operation or in response to an input of a high-speed read operation.

The memory controller 44 controls read, write, and erase operations of the nonvolatile memory device 42 in response to a host request. The memory controller 44 includes at least one central processing unit 44-1, a RAM 44-2, an error correction code (ECC) block 44-3, a host interface 44-5, and an NVM interface 44-6.

The central processing unit 44-1 controls an overall operation of the nonvolatile memory device 42 such as writing, reading, management of a file system, management of bad pages, and so on. The RAM 44-2 operates in response to a control of the central processing unit 44-1 and is used as a working memory, a buffer memory, and a cache memory. If the RAM 44-2 is used as a working memory, data processed by the central processing unit 44-1 may be temporarily stored therein. Used as a buffer memory, the RAM 44-2 is used to buffer data that is transferred from a host to the nonvolatile memory device 42 or from the nonvolatile memory device 42 to the host. As a cache memory, the RAM 44-2 may enable a low-speed nonvolatile memory device 42 to operate at high speed.

The ECC block 44-3 generates an error correction code ECC for correcting a fail bit or an error bit of data received from the nonvolatile memory device 42. The ECC block 44-3 performs error correction encoding on data to be provided to the nonvolatile memory device 42, so parity information is added thereto. The parity information may be stored in the nonvolatile memory device 42. The ECC block 44-3 performs error correction decoding on data output from the nonvolatile memory device 42. The ECC block 44-3 corrects an error using the parity. The ECC block 44-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 44 exchanges data with the host through the host interface 44-5 and with the nonvolatile memory device 42 through the NVM interface 44-6. The host interface 44-5 may be connected with a host via PATA (Parallel AT Attachment bus), SATA (Serial AT attachment bus), SCSI, USB, PCIe, NAND interface, and so on.

In exemplary embodiments, the memory controller 44 may be equipped with a wireless communication function (e.g., Wi-Fi).

The storage device 40 according to an embodiment of the application adjusts a time-read level look-up table in real time and conducts a read operation depending on the adjusted time-read level look-up table, thereby improving reliability of a read operation.

The technology is applicable to a solid state drive (SSD).

Figure 18:
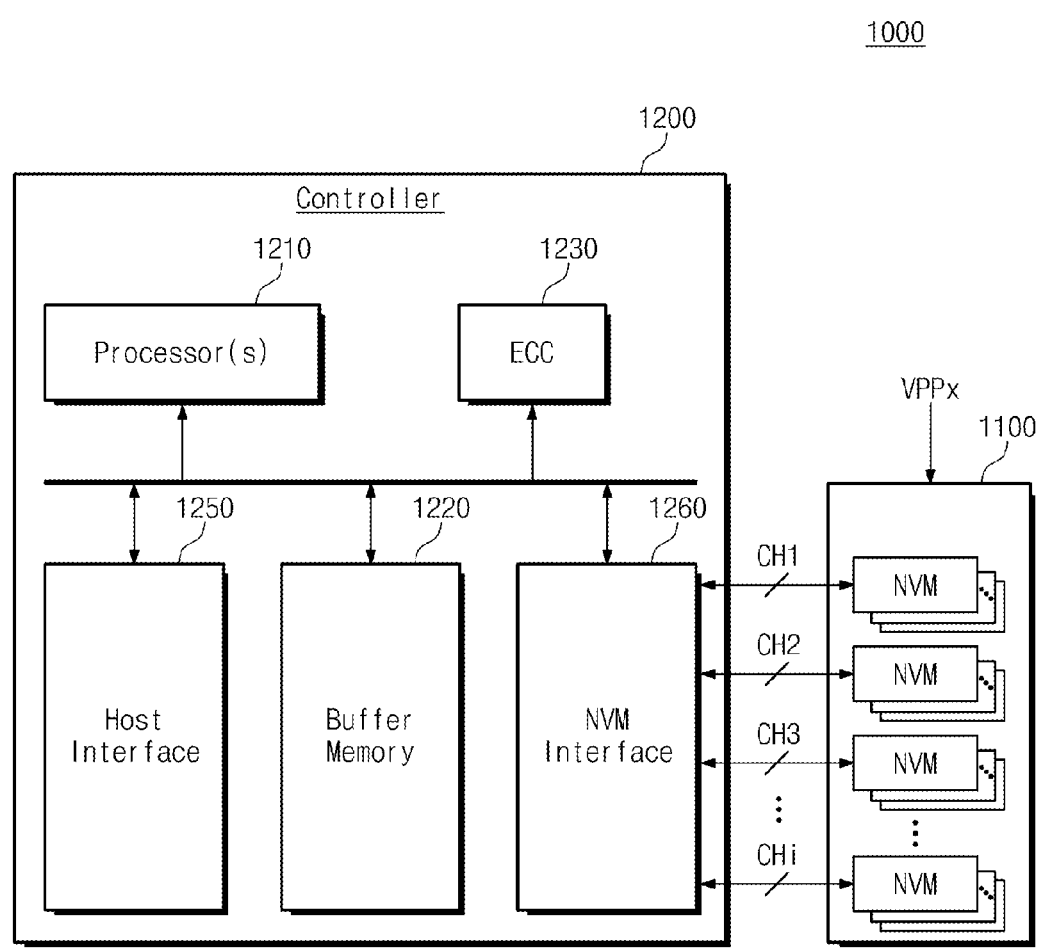
FIG. 18 is a block diagram schematically illustrating a solid state drive according to an embodiment of the application.

FIG. 18 is a block diagram schematically illustrating a solid state drive according to an embodiment of the application. Referring to FIG. 18, a solid state drive (hereinafter, referred to as SSD) 1000 includes a plurality of nonvolatile memory devices 1100 and an SSD controller 1200.

The nonvolatile memory devices 1100 are implemented to be provided with an external high voltage VPPx optionally. Each of the nonvolatile memory devices 1100 may be implemented with the nonvolatile memory device described with reference to FIG. 1, the nonvolatile memory device 100a described with reference to FIG. 14, or the nonvolatile memory device 100b described with reference to FIG. 16.

The SSD controller 1200 is connected to the nonvolatile memory devices 1100 through a plurality of channels CH1 through CHi (i being an integer of 2 or more). The SSD controller 1200 may be implemented with the memory controller 200 described with reference to FIG. 1, the memory controller 200a described with reference to FIG. 14, or the memory controller 200b described with reference to FIG. 16. The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command. The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 20, a code memory may be further included to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

The SSD 1000 according to an embodiment of the application adjusts a time-read level look-up table, thereby making it possible to retain reliability of data for a long time.

The application is applicable to an eMMC (e.g., an embedded multimedia card, moviNAND, iNAND, etc.).

Figure 19:
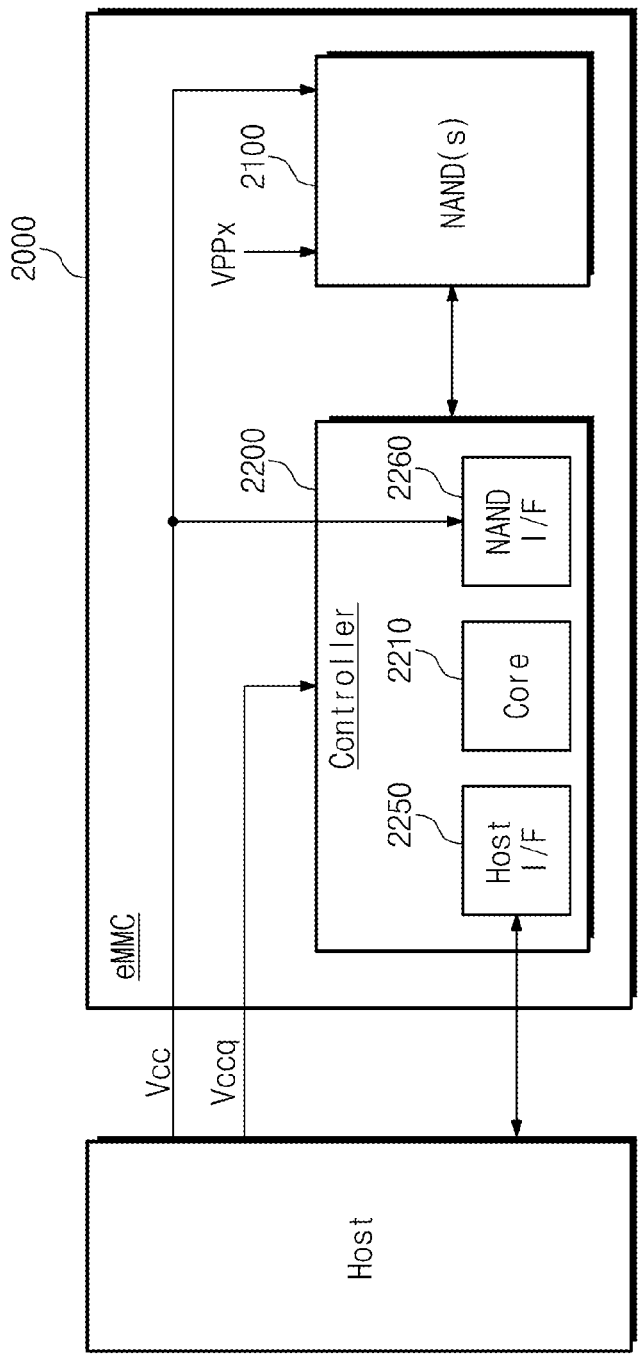
FIG. 19 is a block diagram schematically illustrating an eMMC according to an embodiment of the application.

FIG. 19 is a block diagram schematically illustrating an eMMC according to an embodiment of the application. Referring to FIG. 19, an eMMC 2000 includes one or more NAND flash memory devices 2100 and a controller 2200.

The NAND flash memory device 2100 may be implemented with the nonvolatile memory device described with reference to FIG. 1, the nonvolatile memory device 100*a* described with reference to FIG. 14, or the nonvolatile memory device 100*b* described with reference to FIG. 16. The controller 2200 is connected to the NAND flash memory device 2100 via a plurality of channels. The memory controller 2200 may be implemented with the memory controller 200 described with reference to FIG. 1, the memory controller 200*a* described with reference to FIG. 14, or the memory controller 200*b* described with reference to FIG. 16.

The controller 2200 includes one or more controller cores 2210, a host interface 2250, and a NAND interface 2260. The controller core 2210 may control an overall operation of the eMMC 2000. The host interface 2250 is configured to perform an interface between the controller 2200 and a host. The NAND interface 2260 is configured to provide an interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, etc.). As another example, the host interface 2250 may be a NAND interface.

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 2000 according to an embodiment of the application improves reliability of data, thereby making it possible to lower an error generation rate. This means that a high-speed operation is accomplished.

The technology is applicable to Universal Flash Storage UFS.

Figure 20:
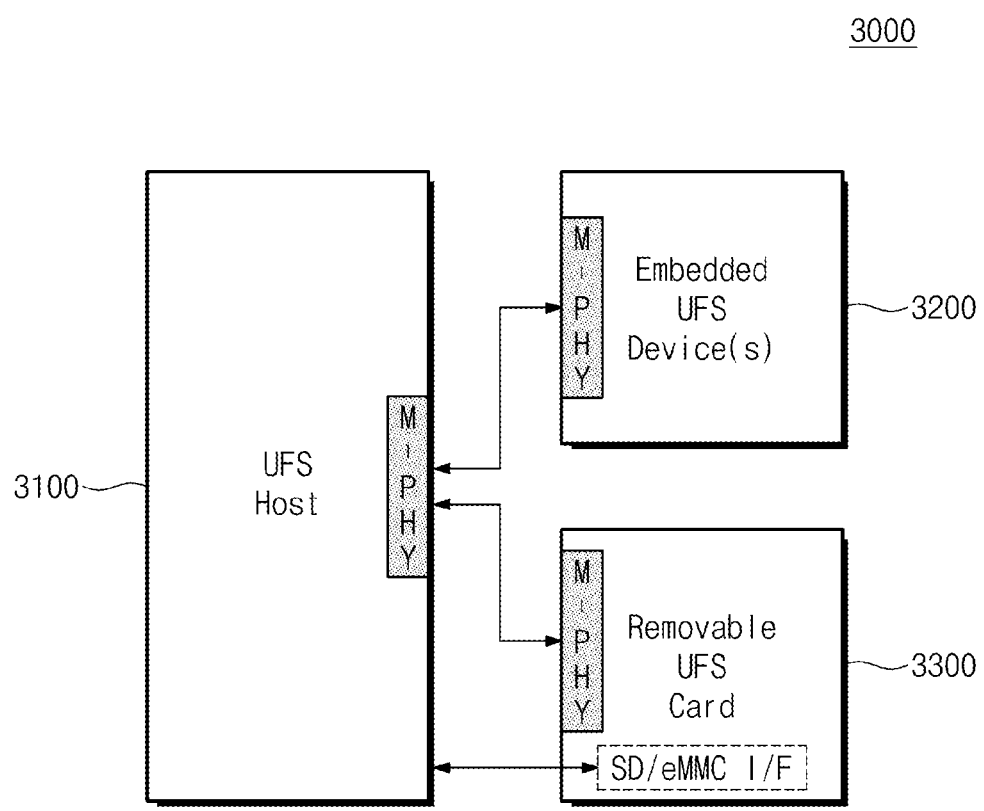
FIG. 20 is a block diagram schematically illustrating a UFS system according to an embodiment of the application.

FIG. 20 is a block diagram schematically illustrating a UFS system according to an embodiment of the application. Referring to FIG. 20, a UFS system 3000 includes a UFS host 3100, an embedded UFS device 3200, and a removable UFS card 3300. Communication between the UFS host 3100 and the embedded UFS device 3200 and communication between the UFS host 3100 and the removable UFS card 3300 may be performed through M-PHY layers.

At least one of the embedded UFS device 3200 and the removable UFS card 3300 may be implemented with the storage device 10 described with reference to FIG. 1, the storage device 20 described with reference to FIG. 14, or the storage device 30 described with reference to FIG. 16.

Meanwhile, the host 3100 includes a bridge that enables the removable UFS card 3300 to communicate using a protocol different from the UFS protocol. The UFS host 3100 and the removable UFS card 3300 may communicate through various card protocols (e.g., UFDs, MMC, SD (secure digital), mini SD, Micro SD, etc.).

The technology is applicable to a mobile device.

Figure 21:
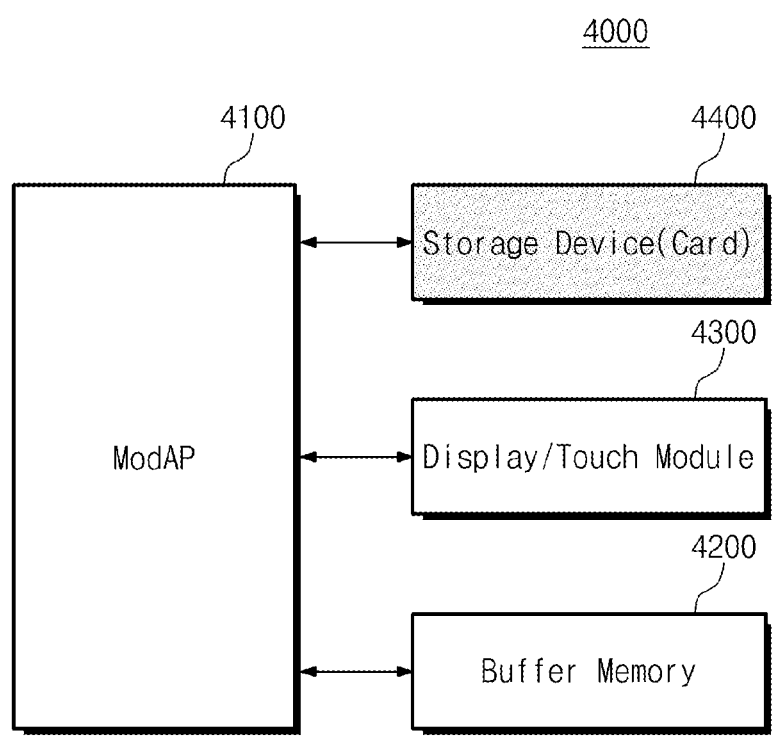
FIG. 21 is a block diagram schematically illustrating a mobile device according to an embodiment of the application.

FIG. 21 is a block diagram schematically illustrating a mobile device 4000 according to an embodiment of the application. Referring to FIG. 21, a mobile device 4000 includes an integrated processor 4100, a buffer memory 4200, a display/touch module 4300, and a storage device 4400.

The integrated processor 4100 controls an overall operation of the mobile device 4000 and wireless/wire communications with an external device. The buffer memory 4200 is configured to store data needed to perform a processing operation of the mobile device 4000. The display/touch module 4300 is implemented to display data processed by the integrated processor 4100 or to receive data through a touch panel. The storage device 4400 is implemented to store user data. The storage device 4400 may be, but not limited to, a memory card, an eMMC, an SSD, or a UFS device. The storage device 4400 may be implemented to adjust a time-read level look-up table as described with reference to FIGS. 1 through 17.

The mobile device 4000 according to an embodiment of the application changes the time-read level look-up table in real time depending on environment information, thereby making it possible to optimize operating performance.

A memory system or a storage device according to the application may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the application has been described with reference to exemplary embodiments, it will be apparent to those skilled in the art that various changes and modifications may be made without departing from the spirit and scope of the present application. Therefore, it should be understood that the above embodiments are not limiting, but illustrative.

What is claimed is:

1. A read method executed by a storage device that includes at least one nonvolatile memory device having: (1) a plurality of strings formed of pillars penetrating word lines stacked between bit lines and a common source line in a direction perpendicular to a substrate and (2) a memory controller to control the at least one nonvolatile memory device, the read method comprising:

performing a first read operation on data stored by the at least one nonvolatile memory device using the time, stored by a time stamp table, at which the data was programmed into the at least one nonvolatile memory device and information of a read level shift stored by a time-read level look-up table, wherein the read level shift exists due to an elapse of time from when the data was programmed into the at least one nonvolatile memory device;

determining whether to adjust the information of the read level shift stored by the time-read level look-up table based on a result of the first read operation;

as a consequence of determining that an adjustment of the information of the read level shift stored by the time-read level look-up table is required, adjusting the information of the read level shift stored by the time-read level look-up table using information acquired through a valley search operation; and performing a second read operation on the data stored by the at least one nonvolatile memory device based on the time stored by the time stamp table and the adjusted information of the read level shift stored by the time-read level look-up table, wherein the information acquired through the valley search operation identifies a read level that reduces the number of errors within a page of data read from the at least one nonvolatile memory device.

2. The read method of claim 1, wherein the adjustment of the information of the read level shift stored by the time-read level look-up table is determined to be required when errors of the data read during the first read operation are uncorrectable.

3. The read method of claim 1, wherein a read voltage for each of the first and second read operations is established using a temperature of the storage device, a temperature of the at least one nonvolatile memory device, a temperature of the memory controller, an address of a memory cell to be read, or a degree of deterioration of the memory cell to be read.

4. The read method of claim 1, wherein the information of the read level shift stored by the time-read level look-up table varies with temperature, an erase count, a program count, a read count, or an address.

5. The read method of claim 1, wherein the valley search operation is performed with respect to at least one page associated with a memory cell to be read.

6. The read method of claim 5, wherein the information of the read level shift stored by the time-read level look-up table is adjusted using a running average of a read level, obtained as a result of a previously executed valley search operation, and the read level identified by the valley search operation.

7. The read method of claim 1, further comprising updating the time-read level look-up table, which is stored within the at least one nonvolatile memory device, periodically or non-periodically.

8. The read method of claim 1, further comprising adjusting an estimated time that has elapsed, from when the data was programmed into the at least one nonvolatile memory device, in accordance with the read level shift.

9. A read method executed by a storage device that includes: (1) at least one nonvolatile memory device having a plurality of strings formed of pillars penetrating word lines stacked between bit lines and a common source line in a direction perpendicular to a substrate and (2) a memory controller to control the at least one nonvolatile memory device, the read method comprising:

determining, in response to an internal or external request issued based on environmental information, whether to adjust information of a read level shift stored by a time-read level look-up table, wherein the determination is based on the amount of time that has elapsed since data was programmed into the at least one nonvolatile memory device;

as a consequence of determining that an adjustment of the information of the read level shift stored by the time-read level look-up table is required, adjusting the information of the read level shift stored by the time-read level look-up table using information acquired through a valley search operation;

performing a read operation on the data stored by the at least one nonvolatile memory device based on the adjusted information of the read level shift stored by the time-read level look-up table and the time, which is stored in a time stamp table, at which the data was programmed into the at least one nonvolatile memory device; and conducting an error correction operation to correct an error of the data read by the read operation, wherein the information acquired through the valley search operation identifies a read level that reduces the number of errors within a page of data read from the at least one nonvolatile memory device.

10. The read method of claim 9, wherein the external request is a reliability-read request or a high-speed read request.

11. The read method of claim 9, wherein the internal request is issued based on a degree of deterioration of the at least one nonvolatile memory device, temperature, and an address associated with a page to be read.

12. The read method of claim 11, wherein a read voltage of the at least one nonvolatile memory device is set using both: (1) the amount of time that has elapsed since a page to be read by the read operation was programmed into the at least one nonvolatile memory device and (2) the degree of deterioration of the at least one nonvolatile memory device, the temperature, or the address.

13. The read method of claim 9, wherein the adjusting comprises:

performing the valley search operation on at least one page stored by the at least one nonvolatile memory device; and calculating a running average of a read level using a read level shift obtained as a result of the valley search operation and a read level shift stored as a result of a previous valley search operation.

14. The read method of claim 9, further comprising providing the time stamp table and the time-read level look-up table read from the at least one nonvolatile memory device to a buffer memory of the memory controller before determining whether to adjust the time-read level look-up table.

15. A read method executed by a storage device that includes: (1) at least one nonvolatile memory device having a plurality of strings formed of pillars penetrating word lines stacked between bit lines and a common source line in a direction perpendicular to a substrate and (2) a memory controller to control the at least one nonvolatile memory device, the read method comprising:

performing a first read operation on data stored by the at least one nonvolatile memory device based on information of a read level shift stored by a time-read level look-up table, wherein the read level shift exists due to an elapse of time from when the data was programmed into the at least one nonvolatile memory device;

performing an error correction operation to correct an error of the data read during the first read operation; and when a result of the error correction operation indicates that the error of the read data is uncorrectable:

adjusting the information of the read level shift stored by the time-read level look-up table using information acquired through a valley search operation that identifies a read level for reducing the number of errors within a page of data read from the at least one nonvolatile memory device, and performing a second read operation on the data stored by the at least one nonvolatile memory device based on the adjusted information of the read level shift.

16. A storage device comprising:
at least one nonvolatile memory device including a plurality of strings formed of pillars penetrating word lines stacked between bit lines and a common source line in a direction perpendicular to a substrate; and
a memory controller to control the at least one nonvolatile memory device, wherein:
the memory controller comprises:
a timer adapted to indicate a current time; and
a read level compensator adapted to set a read voltage based on: (1) the current time, (2) a time, stored by a time stamp table, at which data was programmed into the at least one nonvolatile memory device, and (3) information of a read level shift, wherein the read level shift exists due to an elapse of time from when the data was programmed into the at least one nonvolatile memory device, and
the information of the read level shift, which is stored by a time-read level look-up table, is adjusted in response to an external request or based on environmental information.

17. The storage device of claim 16, wherein each of the plurality of strings comprises at least two pillars.

18. The storage device of claim 16, wherein the at least one nonvolatile memory device stores the time stamp table and the time-read level look-up table.

19. The storage device of claim 18, wherein the information of the read level shift stored by the time-read level look-up table is updated within the at least one nonvolatile memory device periodically or non-periodically.

20. The storage device of claim 16, wherein the memory controller stores the time stamp table and the time-read level look-up table.

21. The storage device of claim 16, wherein:
the memory controller stores a result of a valley search operation conducted on a previous page and adjusts a read level based on a result of a valley search operation conducted on a read page and the stored result, and
the valley search operation identifies a read level that reduces the number of errors within a page of data read from the at least one nonvolatile memory device.

22. The storage device of claim 16, wherein the time stamp table and the time-read level look-up table are managed as a time table.

23. A method of managing a time-read level look-up table stored by a storage device that includes: (1) at least one nonvolatile memory device having a plurality of strings formed of pillars penetrating word lines stacked between bit lines and a common source line in a direction perpendicular to a substrate and (2) a memory controller to control the at least one nonvolatile memory device, the method comprising:

reading a time-read level look-up table from the at least one nonvolatile memory device;

adjusting the time-read level look-up table using information acquired from a valley search operation; and updating the adjusted time-read level look-up table stored by the at least one nonvolatile memory device periodically or non-periodically, wherein the information acquired through the valley search operation identifies a read level that reduces the number of errors within a page of data read from the at least one nonvolatile memory device.

24. The method of claim 23, wherein the adjusting comprises performing the valley search operation when a temperature of the storage device, a temperature of the at least one nonvolatile memory device, or a temperature of the memory controller exceeds a predetermined value.

25. The method of claim 23, wherein the adjusting comprises performing the valley search operation when a program elapsed time exceeds a predetermined value.

26. A method executed by a memory controller of reading data from a nonvolatile memory, the method comprising:

reading the data from the nonvolatile memory using a read voltage selected in accordance with an estimated elapsed time since the data was programmed into the nonvolatile memory;

determining, based upon the data read from the nonvolatile memory using the selected read voltage, whether the read voltage will be changed;

adjusting the read voltage by an identified adjustment value when the determination is affirmative, wherein the adjustment value is identified through a valley search operation that identifies a read voltage for reducing the number of errors within a page of data read from the nonvolatile memory; and reading the data from the nonvolatile memory using the adjusted read voltage when the determination is affirmative.

27. The method of claim 26, further comprising:
performing an error correction operation on the data read from the nonvolatile memory, by way of applying the read voltage to the nonvolatile memory, to determine whether an uncorrectable error exists in the data read from the nonvolatile memory, wherein
the determination to adjust the read voltage is affirmative when the uncorrectable error is determined to exist.

28. The method of claim 26, further comprising:
a) performing an error correction operation on the data most recently read from the nonvolatile memory to determine whether an uncorrectable error exists therein;
b) adjusting the read voltage most recently applied to the nonvolatile memory for reading the data from the nonvolatile memory by a newly identified adjustment value when the uncorrectable error exists in the data most recently read from the nonvolatile memory;
c) reading the data from the nonvolatile memory by applying the read voltage adjusted in operation (b) to the nonvolatile memory; and d) repeating operations (a), (b), and (c) until no uncorrectable error is detected in the most recently read data or a predetermined number of repetitions has occurred.

29. The method of claim 26, wherein the determination to adjust the read voltage is affirmative when an elapsed time from the time the data was written to the nonvolatile memory exceeds a predetermined amount of time or the temperature attributed to the nonvolatile memory exceeds a predetermined temperature.

* * * * *